United States Patent [19]

Tada

[11] Patent Number: 5,625,306

[45] Date of Patent: Apr. 29, 1997

[54] CHARGE PUMPING CIRCUIT AND PLL CIRCUIT

[75] Inventor: Masashige Tada, Hyogo, Japan

[73] Assignee: Mitsubishi Denki Kabushiki Kaisha, Tokyo, Japan

[21] Appl. No.: 524,524

[22] Filed: Sep. 7, 1995

[30] Foreign Application Priority Data

Oct. 31, 1994 [JP] Japan ..................... 6-267045

[51] Int. Cl.$^6$ ....................................... H03K 3/00
[52] U.S. Cl. ........................ 327/112; 327/403; 327/536
[58] Field of Search ........................... 327/112, 403, 327/404, 405, 536, 538; 331/17; 323/312, 315

[56] References Cited

U.S. PATENT DOCUMENTS

| 4,322,643 | 3/1982  | Preslar       | 307/528 |
| 4,897,612 | 1/1990  | Carroll       | 330/253 |
| 5,241,227 | 8/1993  | Jung et al.   | 307/520 |
| 5,357,216 | 10/1994 | Nguyen        | 331/17  |
| 5,453,680 | 9/1995  | Giolma et al. | 323/315 |
| 5,473,283 | 12/1995 | Luich         | 331/17  |

*Primary Examiner*—Timothy P. Callahan
*Assistant Examiner*—Jung Ho Kim
*Attorney, Agent, or Firm*—Oblon, Spivak, McClelland, Maier & Neustadt, P.C.

[57] ABSTRACT

In a charge pumping circuit capable of setting a wide output voltage range, a current mirror circuit (4) is provided with a transistor (T5) having an emitter which is grounded through a resistance (R1) and a collector (base) which is connected to that of a transistor (T2), and a transistor (T6) having an emitter which is grounded through a resistance (R2), and a collector which is connected to an output terminal (3). The transistor (T2) has a base which receives an inverted down signal/DOWN, and an emitter which is connected to a constant current source (1). A current mirror circuit (5) is provided with a transistor (T7) having an emitter which is connected to a power source (VDD) through a resistance (R3) and a collector (base) which is connected to that of a transistor (T4), and a transistor (T8) having an emitter which is connected to the power source (VDD) through the resistance (R2) and a collector which is connected to the output terminal (3). The transistor (T4) further has a base which receives an up signal (UP), and an emitter which is connected to the constant current source (2).

9 Claims, 14 Drawing Sheets

F I G. 3
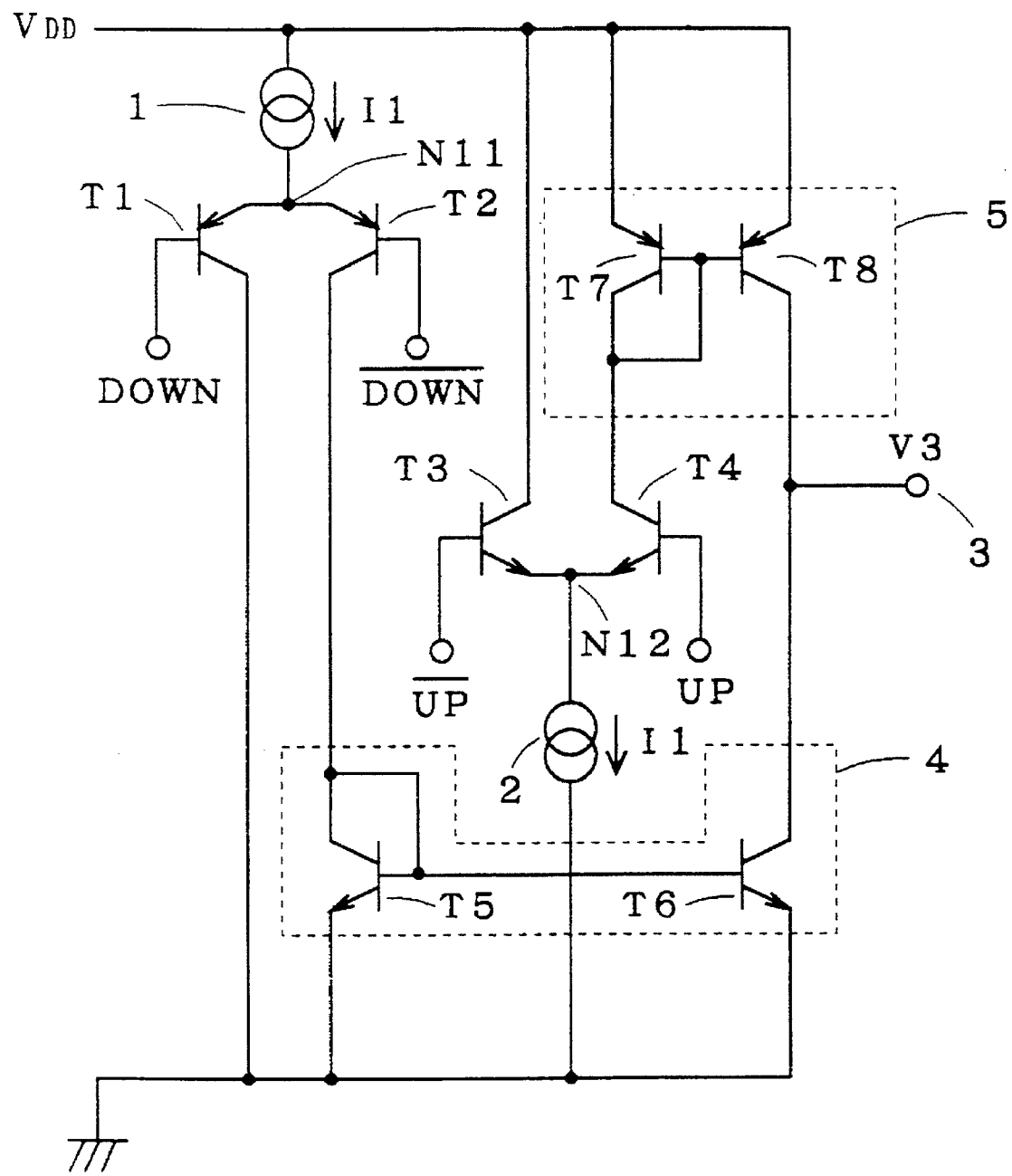

CHARGE PUMPING CIRCUIT AND PLL CIRCUIT

BACKGROUND OF THE INVENTION

1. Field of the Invention

The present invention relates to a charge pumping circuit, and a PLL circuit comprising a charge pumping circuit.

2. Description of the Background Art

FIG. 12 is an explanatory diagram showing the circuit structure of a PLL circuit. As shown in FIG. 12, the PLL circuit is formed by a digital phase comparator 21, a charge pumping circuit 22, a low-pass filter 23, and a voltage controlled oscillator 24.

The digital phase comparator 21 receives input signals SA and SB, brings up and down signals UP and DOWN into active and inactive states respectively on the basis of phase difference between the input signals SA and SB, and outputs the same to the charge pumping circuit 22.

The charge pumping circuit 22 is formed by constant current sources 31 and 32 and switching means 33 and 34, so that the switching means 33, the constant current sources 31 and 32 and the switching means 34 are interposed between a power source VDD and the ground level. The switching means 33 is turned on when the up signal UP is in an active state, for supplying a constant current I0 to a node N1, which is an output part, from the constant current source 31. On the other hand, the switching means 34 is turned on when the down signal DOWN is in an active state, to extract the constant current I0 from the node N I by the constant current source 32.

FIG. 13 is a graph showing exemplary operations of the charge pumping circuit 22 based on the input signals SA and SB. as shown in FIG. 13, the down signal DOWN enters an active state so that the constant current I0 is extracted from the node N1 (−I0) in a period T1 when rise of the input signal SB leads that of the input signal SA, while the up signal UP enters an active state to supply the constant current I0 to the node N1 (+I0) in a period T2 when rise of the input signal SB lags that of the input signal SA.

The low-pass filter 23, having capacitors 35 and 36 and a resistance 37, smooths a voltage which is obtained from the node N1 of the charge pumping circuit 22 and outputs a control voltage SV to the voltage controlled oscillator (VCO) 24.

The voltage controlled oscillator 24 outputs the input signal SB at a frequency which is proportional to the control voltage SV.

In the PLL circuit having the aforementioned structure, the up signal UP of an active state is outputted from the digital phase comparator 21 to increase the control voltage SV thereby increasing the frequency of the input signal SB when the phase of the input signal SB lags that of the input signal SA, while the down signal DOWN of an active state is outputted from the digital phase comparator 21 to reduce the control voltage SV thereby reducing the frequency of the input signal SB when the phase of the input signal SB leads that of the input signal SA. Consequently, the PLL circuit acts to remove the phase difference between the input signals SA and SB, whereby the input signal SB which is in phase with the input signal SA is finally obtained.

FIG. 14 is a circuit diagram showing a concrete internal structure of the charge pumping circuit 22. As shown in FIG. 14, PNP bipolar transistors T51 and T52 have bases which are connected in common, to form a current mirror circuit.

The PNP bipolar transistor T51 has an emitter which is connected to a power source VDD through a resistance R51, and a base and a collector which are connected in common. On the other hand, the PNP bipolar transistor T52 has an emitter which is connected to the power source VDD through a resistance R52, and a collector which is connected to an output terminal 50.

NPN bipolar transistors T53 and T54, forming a differential pair, have bases which receive a down signal DOWN and an inverted down signal/DOWN respectively. Collectors of the NPN bipolar transistors T53 and T54 are connected to the output terminal 50 and the power source VDD respectively. Emitters of the NPN bipolar transistors T53 and T54 are connected in common.

Further, NPN bipolar transistors T55 and T56, forming a differential pair, have bases which receive an up signal UP and an inverted up signal/UP respectively. Collectors of the NPN bipolar transistors T55 and T56 are connected to the power source VDD and the output terminal 50 respectively. Emitters of the NPN bipolar transistors T55 and T56 are connected in common.

Bases of NPN bipolar transistors T58, T59 and T60 are connected in common to that of an NPN bipolar transistor T57 having a common base and a common collector, whereby the NPN bipolar transistors T58, T59 and T60 are current mirror-connected to the NPN bipolar transistor T57.

The collector of the NPN bipolar transistor T57 is connected to the power source VDD through a constant current source 10, and its emitter is grounded through a resistance R53. The NPN bipolar transistor T58 has a collector which is connected to the collector (base) of the NPN bipolar transistor T51, and an emitter which is grounded through a resistance R54. The NPN bipolar transistor T59 has a collector which is connected to the emitters of the NPN bipolar transistors T53 and T54, and an emitter which is grounded through a resistance R55. The NPN bipolar transistor T60 has a collector which is connected to the emitters of the NPN bipolar transistors T55 and T56, and an emitter which is grounded through a resistance R56.

The PNP bipolar transistors T51 and T52 are identical in transistor size to each other, while the NPN bipolar transistors T53 to T60 are also identical in transistor size to each other.

In the charge pumping circuit 22 having the aforementioned structure, the NPN bipolar transistors T58, T59 and T60 are current mirror-connected to the NPN bipolar transistor T57, whereby collector currents I52, I59 and I60 of the PNP bipolar transistor T52 and the NPN bipolar transistors T59 and T60 are equal in amount to the constant current I0 of the constant current source 10.

When the input signal SB leads the input signal SA in the period T1 shown in FIG. 13 in the aforementioned structure, the up signal UP of the digital phase comparator 21 enters an inactive state (low level: ground level) while the down signal DOWN enters an active state (high level: power source VDD level).

At this time, the NPN bipolar transistors T53 and T54 are turned on and off respectively, while the NPN bipolar transistors T55 and T56 are turned off and on respectively. Thus, the collector current I52 is supplied to the output terminal 50, while the collector currents I59 and I60 are extracted through the NPN bipolar transistors T53 and T56 which are in ON states, whereby I0−2·I0=−I0 and the constant current I0 is extracted from the output terminal 50.

When the input signal SB lags the input signal SA in the period T2 shown in FIG. 13, on the other hand, the up signal UP of the digital phase comparator 21 enters an active state while the down signal DOWN enters an inactive state.

At this time, the NPN bipolar transistors T53 and T54 are turned off and on respectively, while the NPN bipolar transistors T55 and T56 are turned on and off respectively. Thus, only the collector current I52 is supplied to the output terminal 50, whereby the constant current I0 is supplied to the output terminal 50.

Thus, the charge pumping circuit 22 carries out a sink operation (extraction) and a source operation (supply) of the constant current I0 on the output terminal 50 on the basis of the up and down signals UP and DOWN of the digital phase comparator 21.

In this case, the voltage range of an output voltage V50 which is obtained from the output terminal 50 is decided as follows:

$$VDD - 3VBE - 2\Delta V \qquad (I)$$

where VBE represents the base-to-emitter voltage of the bipolar transistor (T52, T53 (T56), T59 (T60)), and , $\Delta V$ represents the amount of a voltage drop caused by the resistance (R52, R55 (R56)) which is connected to the emitter of the bipolar transistor.

Thus, the voltage range for the output voltage V50 of the charge pumping circuit 22 is limited. Therefore, the voltage range for the control voltage SV of the voltage controlled oscillator 24 is also limited with limitation in the range of the oscillation frequency of the input signal SB, and hence the locking range of the PLL circuit allowing follow-up by the voltage controlled oscillator 24 is unnecessarily limited. This problem is particularly remarkable when the PLL circuit is in pressure reduction or in a low voltage operation.

SUMMARY OF THE INVENTION

According to a first aspect of the present invention, a charge pumping circuit comprises an output terminal, first current supply means for supplying a first current to a first current path, second current supply means for supplying a second current to a second current path, a first current mirror circuit which is connected to a first power source and the output terminal, for supplying a first current mirror current which is proportional in amount to the first current in a first condition from the first power source to the output terminal in conduction of the first current path, a second current mirror circuit which is connected to a second power source and the output terminal, for supplying a second current mirror current which is proportional in amount to the second current in a second condition from the output terminal to the second power source in conduction of the second current path, and control means receiving a control signal for controlling conduction/disconnection of at least one of the first and second current paths on the basis of the control signal and carrying out a source operation of feeding a current from the first power source to the output terminal or a sink operation of feeding a current from the output terminal to the second power source.

The charge pumping circuit according to the first aspect of the present invention comprises the first current mirror circuit which is connected to the output terminal for feeding the first current mirror current on the basis of the first current flowing through the first current path, and the second current mirror circuit which is connected to the output terminal for feeding the second current mirror current on the basis of the second current flowing through the second current path, for carrying out the source operation of feeding the current over the first power source and the output terminal or the sink operation of feeding the current over the output terminal and the second power source by controlling conduction/disconnection of at least one of the first and second current paths by the control means.

The first and second currents are merely reference currents for deciding the amounts of the first and second current mirror currents, whereby the first and second current paths passing the first and second currents therethrough and the control means for controlling conduction/disconnection of the first and second current paths exert no influences on the potential of the output terminal.

Therefore, only the first and second current mirror circuits which are connected to the output terminal exert influences on the potential of the output terminal, and the range of the output voltage appearing at the output terminal is obtained by subtracting the amount of voltage drops caused by the first and second current mirror circuits from the potential difference between the first and second power sources.

As hereinabove described, the charge pumping circuit according to the first aspect of the present invention comprises the first current mirror circuit which is connected to the output terminal for feeding the first current mirror current on the basis of the first current flowing through the first current path, and the second current mirror circuit which is connected to the output terminal for feeding the second current mirror current on the basis of the second current flowing through the second current path, for carrying out the source operation of feeding the current over the first power source and the output terminal or the sink operation of feeding the current from the output terminal to the second power source by controlling conduction/disconnection of at least one of the first and second current paths by the control means.

The first and second currents are merely reference currents for deciding the amounts of the first and second current mirror currents, whereby the first and second current paths passing the first and second currents therethrough and the control means for controlling conduction/disconnection of the first and second current paths exert no influences on the potential of the output terminal.

Therefore, only the first and second current mirror circuits which are connected to the output terminal exert influences on the potential of the output terminal, and the range of the output voltage appearing at the output terminal is obtained by subtracting the amount of voltage drops caused by the first and second current mirror circuits from the potential difference between the first and second power sources.

Consequently, the output voltage of the charge pumping circuit can be set in a wider range as compared with the prior art, since no amount of a voltage drop caused by the control means is included.

According to a second aspect of the present invention, the control means carries out the source operation or the sink operation by bringing one of the first and second current paths into a conducting state and bringing the other one into a cutoff state.

Preferably, the control signal has first and second switching control signals, and the control means comprises first switching means which is provided on the first current path for allowing conduction of/cutting off the first current path on the basis of the first switching control signal, and second switching means which is provided on the second current path for allowing conduction of/cutting off the second current path on the basis of the second switching control signal.

Preferably, the first and second switching signals are complementary logic signals, the first switching means is formed by a differential pair of first conductivity type first and second transistors, for receiving the first switching control signal and a logically inverted signal of the first switching signal in control electrodes of the first and second transistors respectively, and allowing conduction of/cutting off the first current path by an on/off operation of one of the first and second transistors, and the second switching means is formed by a differential pair of second conductivity type third and fourth transistors, for receiving the second switching control signal and a logically inverted signal of the second switching signal in control electrodes of the third and fourth transistors respectively, and allowing conduction of/cutting off the second current path by an on/off operation of one of the third and fourth transistors.

Preferably, the first current mirror circuit is connected to the first power source through a first resistance component, and the second current mirror circuit is connected to the second power source through a second resistance component.

Preferably, the first current mirror circuit is directly connected to the first power source, and the second current mirror circuit is directly connected to the second power source.

Preferably, the first resistance component has first and second resistances and the second resistance component has third and fourth resistances, the first current mirror circuit has second conductivity type fifth and sixth transistors sharing a control electrode, while the fifth transistor has a first electrode which is connected to the first power source through the first resistance as well as the control electrode and a second electrode which are connected to the first current path and the sixth transistor has a first electrode which is connected to the first power source through the second resistance and a second electrode which is connected to the output terminal, and the second current mirror circuit has first conductivity type seventh and eighth transistors sharing a control electrode while the seventh transistor has a first electrode which is connected to the second power source through the third resistance as well as the control electrode and a second electrode which are connected to the second current path while the eighth electrode has a first electrode which is connected to the second power source through the fourth resistance and a second electrode which is connected to the output terminal.

Preferably, the first conductivity type is an N type, and the second conductivity type is a P type.

Preferably, the first to eighth transistors are bipolar transistors.

Preferably, the first to eighth transistors are MOS transistors.

Namely, the control means brings the first and second current paths into conducting and non-conducting states respectively thereby supplying only the first current mirror current from the first current mirror circuit for carrying out the source operation, or brings the second and first current paths into conducting and non-conducting states respectively thereby supplying only the second current mirror current from the second current mirror circuit for carrying out the sink operation.

The control means provided in the charge pumping circuit according to the second aspect of the present invention carries out the source operation or the sink operation by bringing one of the first and second current paths into a conducting state while bringing the other one into a cutoff state.

Namely, the control means brings the first and second current paths into conducting and non-conducting states respectively thereby supplying only the first current mirror current from the first current mirror circuit for carrying out the source operation, or brings the second and first current paths into conducting and non-conducting states respectively thereby supplying only the second current mirror current from the second current mirror circuit for carrying out the sink operation.

According to a third aspect of the present invention, the second current is larger in amount than the first current, and the first and second conditions for the first and second current mirror circuits are identical to each other, the first current path is regularly set in a conducting state, and the control means carries out the source operation or the sink operation by allowing conduction of/cutting off the second current path.

In the charge pumping circuit according to the third aspect of the present invention, the amount of the second current is larger than that of the first current and the first and second conditions for the first and second current mirror circuits are identical to each other, whereby the amount of the second current mirror current is larger than that of the first current mirror current.

The first current path is regularly set in a conducting state and the second current path is allowed to conduct/cut off by the control means, for carrying out the source operation or the sink operation.

Namely, the control means brings he second current path into a conducting state for supplying the second current mirror current which is larger in amount than the first current mirror current from the second current mirror circuit thereby feeding the current of an amount obtained by subtracting the amount of the first current mirror current from that of the second current mirror current from the output terminal to the second power source for carrying out the sink operation, or brings the second current path into a cutoff state to supply only the first current mirror current, for carrying out the source operation.

The control means controls conduction/non-conduction of the second current path without controlling the first current path, whereby the control means can be formed by an element which is suitable for only the second current mirror circuit supplying the second current mirror current on the basis of the second current.

In the charge pumping circuit according to the third aspect of the present invention, the amount of the second current is larger than that of the first current and the first and second conditions for the, first and second current mirror circuits are identical to each other, whereby the amount of the second current mirror current is larger than that of the first current mirror current.

The first current path is regularly set in a conducting state and the second current path is allowed to conduct/cut off by the control means, for carrying out the source operation or the sink operation.

Namely, the control means brings the second current path into a conducting state for supplying the second current mirror current which is larger in amount than the first current mirror current from the second current mirror circuit thereby feeding the current of an amount obtained by subtracting the amount of the first current mirror current from that of the second current mirror current over the output terminal and the second power source for carrying out the sink operation, or brings the second current path into a cutoff state to supply only the first current mirror current, for carrying out the source operation.

The control means controls conduction/non-conduction of the second current path without controlling the first current path, whereby the control means can be formed by an element which is suitable for only the second current mirror circuit supplying the second current mirror current on the basis of the second current.

Consequently, operation characteristics of the control means can be improved.

According to a fourth aspect of the present invention, the second current path consists of first and second partial current paths which are independent of each other, the second current supply means comprises first partial current supply means for supplying the first partial current path with a first partial current which is identical in amount to the first current, and second partial current supply means for supplying the second partial current path with a second partial current which is identical in amount to the first current, while the total amount of the first and second partial currents are defined as the amount of the second current, the second current mirror circuit comprises a first partial current mirror circuit which is connected to the second power source and the output terminal for supplying a first partial current mirror current which is proportional in amount to the first partial current in the second condition from the output terminal to the second power source in conduction of the first partial current path, and a second partial current mirror circuit which is connected to the second power source and the output terminal for supplying a second partial current mirror current which is proportional in amount to the second partial current in the second condition from the output terminal to the second power source in conduction of the second partial current path, while the total amount of the first and second partial current mirror currents are defined as the amount of the second current mirror current, the control signal has first and second switching control signals, and the control means comprises first switching means which is provided on the first partial current path for allowing conduction of/cutting off the first partial current path on the basis of the first switching control signal, and second switching means which is provided on the second partial current path for allowing conduction of/cutting off the second partial current path on the basis of the second switching control signal.

Preferably, the first and second switching control signals are complementary logic signals, the first switching means is formed by a differential pair of first conductivity type first and second transistors, for receiving the first switching control signal and a logically inverted signal of the first switching signal in control electrodes of the first and second transistors respectively, and allowing conduction of/cutting off the first partial current path by an on/off operation of one of the first and second transistors, and the second switching means is formed by a differential pair of first conductivity type third and fourth transistors, for receiving the second switching control signal and a logically inverted signal of the second switching signal in control electrodes of the third and fourth transistors respectively, and allowing conduction of/cutting off the second partial current path by an on/off operation of one of the third and fourth transistors.

Preferably, the first current mirror circuit is connected to the first power source through a first resistance component, and the first and second partial current mirror circuits are connected to the second power source through second and third resistance components respectively.

Preferably, the first current mirror circuit is directly connected to the first power source, and the first and second partial current mirror circuits are directly connected to the second power source.

Preferably, the first resistance component has first and second resistances, the second resistance component has third and fourth resistances, and the third resistance component has fifth and sixth resistances, the first current mirror has first conductivity type fifth and sixth transistors sharing a control electrode while the fifth transistor has a first electrode which is connected to the first power source through the first resistance as well as the control electrode and a second electrode which are connected to the first current path and the sixth transistor has a first electrode which is connected to the first power source through the second resistance and a second electrode which is connected to the output terminal, the first partial current mirror circuit has second conductivity type seventh and eighth transistors sharing a control electrode while the seventh transistor has a first electrode which is connected to the second power source through the third resistance as well as the control electrode and a second electrode which are connected to the first partial current path and the eighth electrode has a first electrode which is connected to the second power source through the fourth resistance and a second electrode which is connected to the output terminal, and the second partial current mirror circuit has second conductivity type ninth and tenth transistors sharing a control electrode while the ninth transistor has a first electrode which is connected to the second power source through the fifth resistance as well as the control electrode and a second electrode which are connected to the second partial current path and the tenth electrode has a first electrode which is connected to the second power source through the sixth resistance and a second electrode which is connected to the output terminal.

Preferably, the first conductivity type is a P type, and the second conductivity type is an N type.

Preferably, the first to tenth transistors are bipolar transistors.

Preferably, the first to tenth transistors are MOS transistors.

In the charge pumping circuit according to the fourth aspect of the present invention, the first and second switching means bring both of the first and second partial current paths into conducting states for supplying the first and second partial current mirror currents from the first and second partial current mirror circuits, thereby feeding a current of an amount obtained by subtracting the amount of the first current mirror current from the total amount of the first and second partial current mirror currents, i.e., a current which is equal in amount to the first current mirror current, over the output terminal and the second power source for carrying out the sink operation, or bring both of the first and second partial current paths into cutoff states for supplying only the first current mirror current, thereby carrying out the source operation.

The first and second switching means control conduction/non-conduction of the first and second partial current paths of the second current path without controlling the first current path, whereby the first and second switching means can be formed by elements which are suitable for only the second current mirror circuit which is connected to the second power source for supplying the second current mirror current on the basis of the second current.

In the charge pumping circuit according to the fourth aspect of the present invention, the first and second switching means bring both of the first and second partial current paths into conducting states for supplying the first and second partial current mirror currents from the first and second partial current mirror circuits, thereby feeding a current of an amount obtained by subtracting the amount of the first current mirror current from the total amount of the first and second partial current mirror currents, i.e., a current which is equal in amount to the first current mirror current, from the output terminal to the second power source for carrying out the sink operation, or bring both of the first and second partial current paths into cutoff states for supplying only the first current mirror current, thereby carrying out the source operation.

The first and second switching means control conduction/ non-conduction of the first and second partial current paths of the second current path without controlling the first current path, whereby the first and second switching means can be formed by elements which are suitable for only the second current mirror circuit which is connected to the second power source for supplying the second current mirror current on the basis of the second current.

Consequently, the first and second switching means can be formed by switching elements of the same conductivity type, whereby the first and second switching means can be correctly matched with the switching time, thereby improving operation characteristics.

According to a fifth aspect of the present invention, the second current path consists of first and second partial current paths, the second current supply means comprises first partial current supply means for supplying a first partial current to the first partial current path, and second partial current supply means for supplying a second partial current to the second partial current path while the total amount of the first and second partial currents are defined as the amount of the second current, the second current mirror circuit is connected to the second power source and the output terminal for supplying, in conduction of at least one of the first and second partial current paths, the second current mirror current which is proportional in amount to a current flowing the conducting current path in the second condition from the output terminal to the second power source, the control signal has first and second switching control signals, and the control means comprises first switching means for making connection/non-connection between the first partial current path and the second power source on the basis of the first switching control signal, thereby cutting off/allowing conduction of the first partial current path, and second switching means for making connection/non-connection between the second partial current path and the second power source on the basis of the second switching control signal, thereby cutting off/allowing conduction of the second partial current path.

Preferably, the first and second switching control signals are complementary logic signals, the first switching means is provided with a first conductivity type first transistor having a control electrode receiving the first switching control signal, a first electrode which is connected to the second power source, and a second electrode which is connected to a first node of the first partial current path, for cutting off/allowing conduction of the first partial current path by an on/off operation of the first transistor, and the second switching means is provided with a first conductivity type second transistor having a control electrode receiving the second switching control signal, a first electrode which is connected to the second power source, and a second electrode which is connected to a second node of the second partial current path, for cutting off/allowing conduction of the second partial current path by an on/off operation of the second transistor.

Preferably, the first current mirror circuit is connected to the first power source through a first resistance component, and the second current mirror circuit is connected to the second power source through a second resistance component.

Preferably, the first current mirror circuit is directly connected to the first power source, and the second current mirror circuit is directly connected to the second power source.

Preferably, the first resistance component has first and second resistances and the second resistance component has third and fourth resistances, the first current mirror circuit has second conductivity type third and fourth transistors sharing a control electrode while the third transistor has a first electrode which is connected to the first power source through the first resistance as well as the control electrode and a second electrode which are connected to the first current path, the fourth transistor has a first electrode which is connected to the first power source through the second resistance, and a second electrode which is connected to the output terminal, and the second current mirror circuit has first conductivity type fifth and sixth transistors sharing a control electrode while the fifth transistor has a first electrode which is connected to the second power source through the third resistance as well as the control electrode and a second electrode which are connected to the first and second partial current paths in common, the sixth transistor has a first electrode which is connected to the second power source through the fourth resistance, and a second electrode which is connected to the output terminal.

Preferably, the charge pumping circuit further comprises a first diode having an anode which is connected to the first node of the first partial current path, and a cathode which is connected to the second electrode of the fifth transistor of the second current mirror circuit, and a second diode having an anode which is connected to the node of the second partial current path, and a cathode which is connected to the second electrode of the fifth transistor of the second current mirror circuit.

Preferably, the first conductivity type is an N type, and the second conductivity type is a P type.

Preferably, the first to sixth transistors are bipolar transistors.

Preferably, the first to sixth transistors are MOS transistors.

The charge pumping circuit according to the fifth aspect of the present invention comprises the first switching means which is connected to the first partial current path for performing connection/non-connection of the first partial current path with the second power source on the basis of the first switching control signal thereby cutting off/allowing conduction of the first partial current path, and the second switching means which is connected to the second partial current path for performing connection/non-connection of the second partial current path with the second power source on the basis of the second switching control signal thereby cutting off/allowing conduction of the second partial current path, as control means.

The first and second switching means bring both of the first and second partial current paths into conducting states for supplying the second current mirror current which is twice the first current mirror current in amount from the second current mirror circuit, thereby feeding a current of an amount obtained by subtracting the amount of the first current mirror current from that of the second current mirror current, i.e., a current which is equal in amount to the first current mirror current, from the output terminal to the second power source for carrying out the sink operation, or bring both of the first and second partial current paths into cutoff states for supplying only the first current mirror current, thereby carrying out the source operation.

The first and second switching means control conduction/non-conduction of the first and second partial current paths of the second current path without controlling the first current path, whereby the first and second switching means can be formed by elements which are suitable for only the second current mirror circuit which is connected to the second power source for supplying the second current mirror current on the basis of the second current.

Further, the first and second switching means perform connection/non-connection of the first and second partial current paths with the second power source on the basis of the first and second switching control signals respectively, whereby high-speed switching operations are enabled by employment of one-unit switching elements such as NPN bipolar transistors capable of carrying out relatively high speed operations.

The charge pumping circuit according to the fifth aspect of the present invention comprises the first switching means which is connected to the first partial current path for performing connection/non-connection of the first partial current path with the second power source on the basis of the first switching control signal thereby cutting off/allowing conduction of the first partial current path, and the second switching means which is connected to the second partial current path for performing connection/non-connection of the second partial current path with the second power source on the basis of the second switching control signal thereby cutting off/allowing conduction of the second partial current path, as control means.

The first and second switching means control conduction/non-conduction or the first and second partial current paths of the second current path without controlling the first current path, whereby the first and second switching means can be formed by elements which are suitable for only the second current mirror circuit which is connected to the second power source for supplying the second current mirror current on the basis of the second current.

Consequently, the first and second switching means can be formed by switching elements of the same conductivity type, whereby the first and second switching means can be correctly matched with the switching time, thereby improving operation characteristics.

Further, the first and second switching means perform connection/non-connection of the first and second partial current paths with the second power source on the basis of the first and second switching control signals respectively, whereby high-speed switching operations are enabled by employment of one-unit switching elements such as NPN bipolar transistors capable of carrying out relatively high speed operations.

According to a sixth aspect of the present invention, a PLL circuit comprises phase comparison means receiving first and second input signals for outputting a control signal on the basis of phase difference between the first and second input signals, a charge pumping circuit receiving the control signal for outputting an output voltage on the basis of the control signal, filtering means filtering the output voltage for obtaining a control voltage, and oscillation means receiving the control voltage for outputting the second input signal which is oscillated at a frequency based on the control voltage, while the charge pumping circuit comprises an output terminal obtaining the output voltage, first current supply means for supplying a first current to a first current path, second current supply means for supplying a second current to a second current path, a first current mirror circuit which is connected to a first power source and the output terminal for supplying a first current mirror current which is proportional in amount to the first current in a first condition from the first power source to the output terminal in conduction of the first current path, a second current mirror circuit which is connected to a second power source and the output terminal, for supplying a second current mirror current which is proportional in amount to the second current in a second condition from the output terminal to the second power source in conduction of the second current path, and control means controlling conduction/disconnection of at least one of the first and second current paths on the basis of the control signal and carrying out a source operation of feeding a current from the first power source to the output terminal or a sink operation of feeding a current from the output terminal to the second power source.

The charge pumping circuit according to the sixth aspect of the present invention comprises the first current mirror circuit which is connected to the output terminal for feeding the first current mirror current on the basis of the first current flowing through the first current path and the second current mirror circuit which is connected to the output terminal for feeding the second current mirror current on the basis of the second current flowing through the second current path, and controls conduction/disconnection of at least one of the first and second current paths by the control means, for carrying out the source operation of feeding the current over the first power source and the output terminal or the sink operation of feeding the current over the output terminal and the second power source.

The first and second currents are merely reference currents for deciding the amounts of the first and second current mirror currents, whereby the first and second current paths passing the first and second currents therethrough and the control means for controlling conduction/disconnection of the first and second current paths exert no influences on the potential of the output terminal.

Therefore, only the first and second current mirror circuits which are connected to the output terminal exert influences on the potential of the output terminal, and the range of the output voltage appearing at the output terminal is obtained by subtracting the amount of voltage drops caused by the first and second current mirror circuits from the potential difference between the first and second power sources.

The charge pumping circuit according to the sixth aspect of the present invention comprises the first current mirror circuit which is connected to the output terminal for feeding the first current mirror current on the basis of the first current flowing through the first current path and the second current mirror circuit which is connected to the output terminal for feeding the second current mirror current on the basis of the second current flowing through the second current path, and controls conduction/disconnection of at least one of the first and second current paths by the control means, for carrying out the source operation of feeding the current from the first power source to the output terminal or the sink operation of feeding the current from the output terminal to the second power source.

The first and second currents are merely reference currents for deciding the amounts of the first and second current mirror currents, whereby the first and second current paths passing the first and second currents therethrough and the control means for controlling conduction/disconnection of the first and second current paths exert no influences on the potential of the output terminal.

Therefore, only the first and second current mirror circuits which are connected to the output terminal exert influences on the potential of the output terminal, and the range of the output voltage appearing at the output terminal is obtained by subtracting the amount of voltage drops caused by the first and second current mirror circuits from the potential difference between the first and second power sources.

The output voltage of the charge pumping circuit can be set in a wider range as compared with the prior art, since no amount of voltage drops caused by the control means is included. Consequently, the range of the oscillation frequency of the second input signal which is outputted from the oscillation means is also widened, whereby the locking range of the PLL circuit can be effectively set to be wider than that in the prior art. This effect is particularly effective for making the PLL circuit carry out a pressure reducing operation or a low voltage operation.

Accordingly, an object of the present invention is to obtain a charge pumping circuit which can set a wide output voltage range, and a PLL circuit which can set a wide locking range.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a circuit diagram showing a first modification of the first embodiment;

DESCRIPTION OF THE PREFERRED EMBODIMENTS

<<First Embodiment>>

Figure 1:
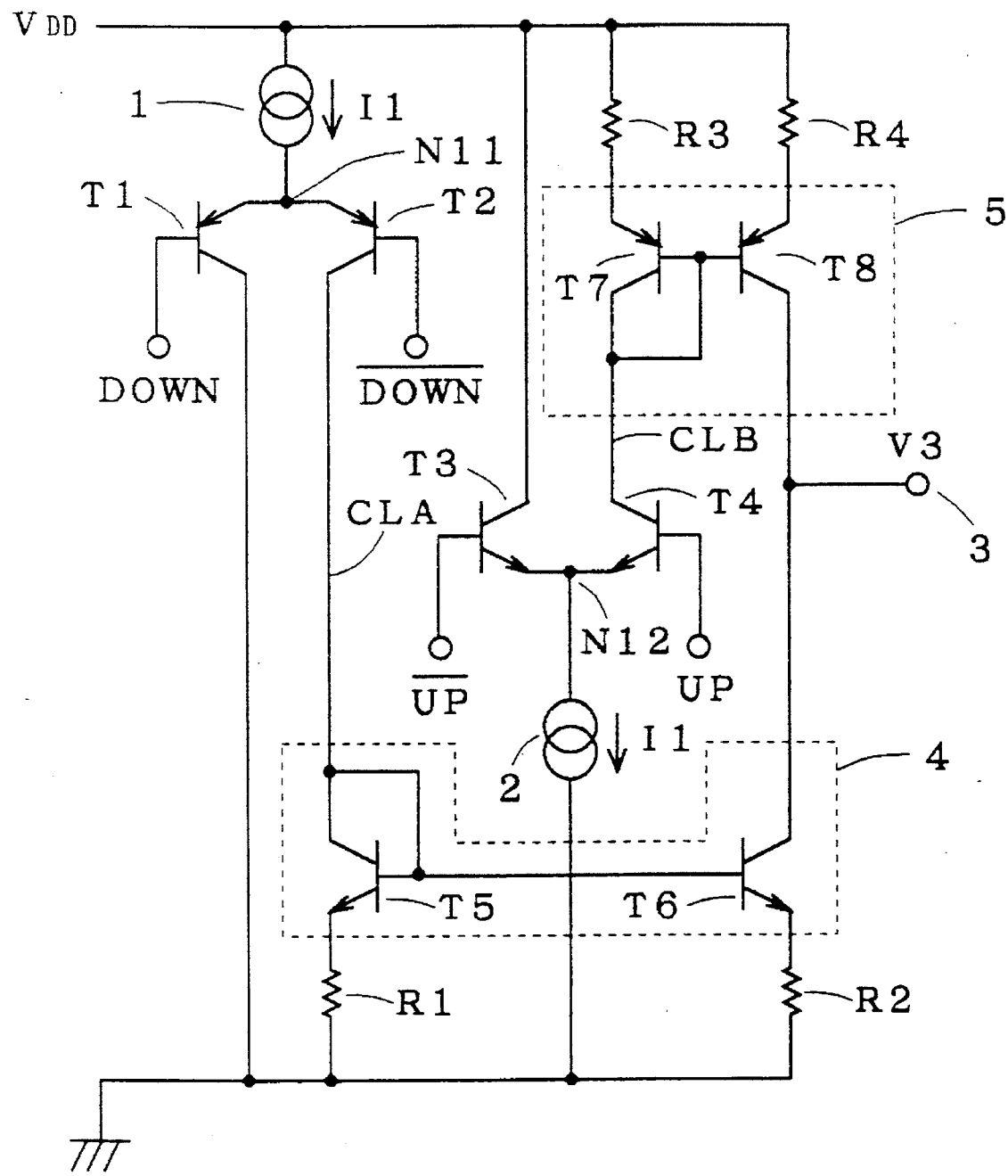
FIG. 1 is a circuit diagram showing the structure of a charge pumping circuit according to a first embodiment of the present invention.

FIG. 1 is a circuit diagram showing the internal structure of a charge pumping circuit according to a first embodiment of the present invention. The charge pumping circuit according to the first embodiment is inserted between the digital phase comparator 21 and the low-pass filter 23 in the PLL circuit shown in FIG. 12, similarly to the prior art.

As shown in FIG. 1, PNP bipolar transistors T1 and T2 form a differential pair, and bases thereof receive a down signal DOWN and an inverted down signal /DOWN respectively. Emitters of the PNP bipolar transistors T1 and T2 are connected in common at a node N11, while a constant current source 1 is interposed between the node N11 and a power source VDD. A collector of the PNP bipolar transistor T1 is grounded.

On the other hand, NPN bipolar transistors T3 and T4 form a differential pair, and bases thereof receive an inverted up signal /UP and an up signal UP respectively. Emitters of the NPN bipolar transistors T3 and T4 are connected in common at a node N12, while a constant current source 2 is interposed between the node N12 and the ground level. A collector of the NPN bipolar transistor T3 is connected to the power source VDD.

NPN bipolar transistors T5 and T6 form a current mirror circuit 4, with bases which are connected in common. An emitter of the NPN bipolar transistor T5 having a collector which is common with the base is grounded through a resistance R1, while its collector (base) is connected to that of the PNP bipolar transistor T2. An emitter of the NPN bipolar transistor T6 is grounded through a resistance R2, and its collector is connected to an output terminal 3.

Therefore, a current path CLA between the constant current source 1 and the current mirror circuit 4 enters a conducting state when the PNP bipolar transistor T2 is in an ON state, while the former enters a non-conducting state when the latter is in an OFF state. When the PNP bipolar transistor T2 is in an ON state (the current path CLA is in a conducting state), a current of an amount I1 which is supplied from the constant current source 1 through the current path CLA flows as a collector current of the NPN bipolar transistor T6. Namely, the PNP bipolar transistors T1 and T2 forming a differential pair serve as switching means controlling conduction/disconnection of the current path CLA.

PNP bipolar transistors T7 and T8 form a current mirror circuit 5 with bases which are connected in common. An emitter of the PNP bipolar transistor T7 having a collector which is in common with the base is connected to the power source VDD through a resistance R3, while its collector (base) is connected to that of the NPN bipolar transistor T4. An emitter of the PNP bipolar transistor T8 is connected to the power source VDD through a resistance R4, and its collector is connected to the output terminal 3.

Therefore, a current path CLB between the constant current source 2 and the current mirror circuit 5 enters a conducting state when the NPN bipolar transistor T4 is in an ON state, while the former enters a non-conducting state when the latter is in an OFF state. When the NPN bipolar transistor T4 is in an ON state (the current path CLB is in a conducting state), the current of the amount I1 flowing through the current path CLA flows as a collector current of the PNP bipolar transistor T8. Namely, the NPN bipolar transistors T3 and T4 forming a differential pair serve as switching means controlling conduction/disconnection of the current path CLB.

Each of the constant current sources 1 and 2 supplies a current of the amount I1, while the PNP bipolar transistors T1, T2, T7 and T8 are identical in transistor size to each other, the NPN bipolar transistors T3 to T6 are also identical in transistor size to each other, and the resistances R1 to R4 are set at the same resistance values.

Figure 2:
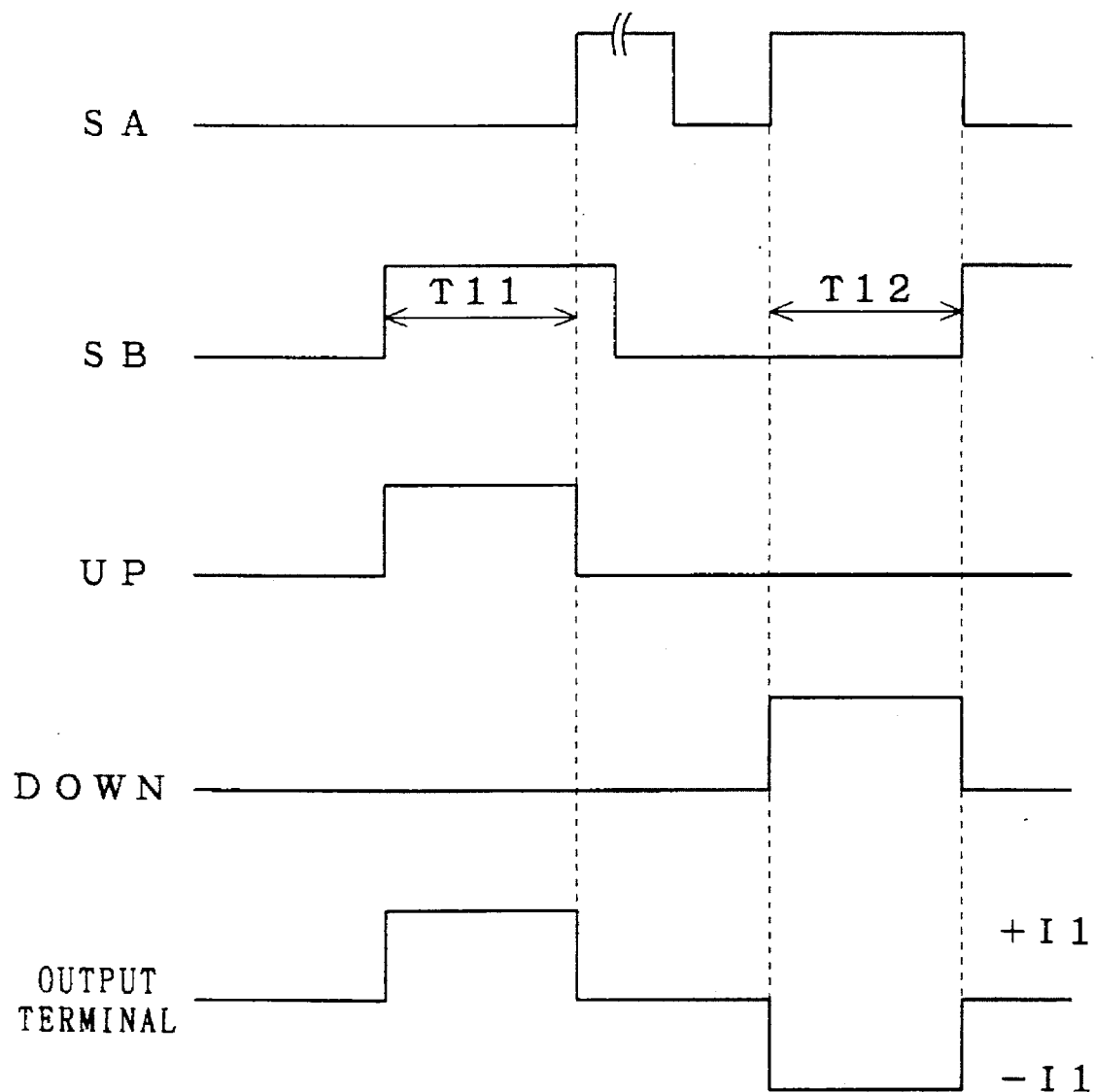
FIG. 2 is a waveform diagram showing operations of the charge pumping circuit according to the first embodiment.

In a period T11 shown in FIG. 2 when an input signal SB lags an input signal SA in the aforementioned structure, the up signal UP and the down signal DOWN of the digital phase comparator 21 enter an active state (high level: power source VDD level) and an inactive state (low level: ground level) respectively.

At this time, the PNP bipolar transistors T1 and T2 are turned on and off respectively, while the NPN bipolar transistors T3 and T4 are turned off and on respectively. Thus, the current paths CLA and CLB enter a non-conducting state and a conducting state respectively.

Consequently, the collector current (amount: I1) of the PNP bipolar transistor T8 is supplied to the output terminal 3.

In a period T12 shown in FIG. 2 when the input signal SB leads the input signal SA, on the other hand, the up signal UP and the down signal DOWN of the digital phase comparator 21 enter an inactive state and an active state respectively.

At this time, the PNP bipolar transistors T1 and T2 are turned off and on respectively, while the NPN bipolar transistors T3 and T4 are turned on and off respectively. Thus, the current paths CLA and CLB enter a conducting state and a non-conducting state respectively.

Consequently, the collector current (amount: I1) of the NPN bipolar transistor T6 is extracted from the output terminal 3.

When both of the up signal UP and the down signal DOWN of the digital phase comparator 21 are in inactive states, the PNP bipolar transistors T1 and T2 are turned on and off respectively, while the NPN bipolar transistors T3 and T4 are also turned on and off respectively. Therefore, both of the current paths CLA and CLB enter non-conducting states, and hence no current flows to the output terminal 3.

Thus, the charge pumping circuit according to the first embodiment carries out a sink operation (extraction) and a source operation (supply) on the constant current I1 with respect to the output terminal 3, on the basis of the up signal UP and the down signal DOWN of the digital phase comparator 21.

In the charge pumping circuit according to the first embodiment, high level side voltage drop elements are the PNP bipolar transistor T8 and the resistance R4 while low level side voltage build-up elements are the NPN bipolar transistor T6 and the resistance R2, whereby the voltage range of an output voltage V3 which is obtained from the output terminal 3 is decided in the following expression (II):

$$VDD-2VBE-2\Delta V \quad \text{(II)}$$

where VBE represents the base-to-emitter voltage (about 0.8 V in general) of the bipolar transistor (T8, T6), and $\Delta$ represents the amount of a voltage drop (about 0.3 V in general) caused by the resistance (R4, R2) which is connected to the emitter of the bipolar transistor.

As clearly understood from the expression (II), the charge pumping circuit according to the first embodiment can widen the voltage range of the output voltage V3 by 1VBE as compared with that of a conventional structure.

Figure 12:
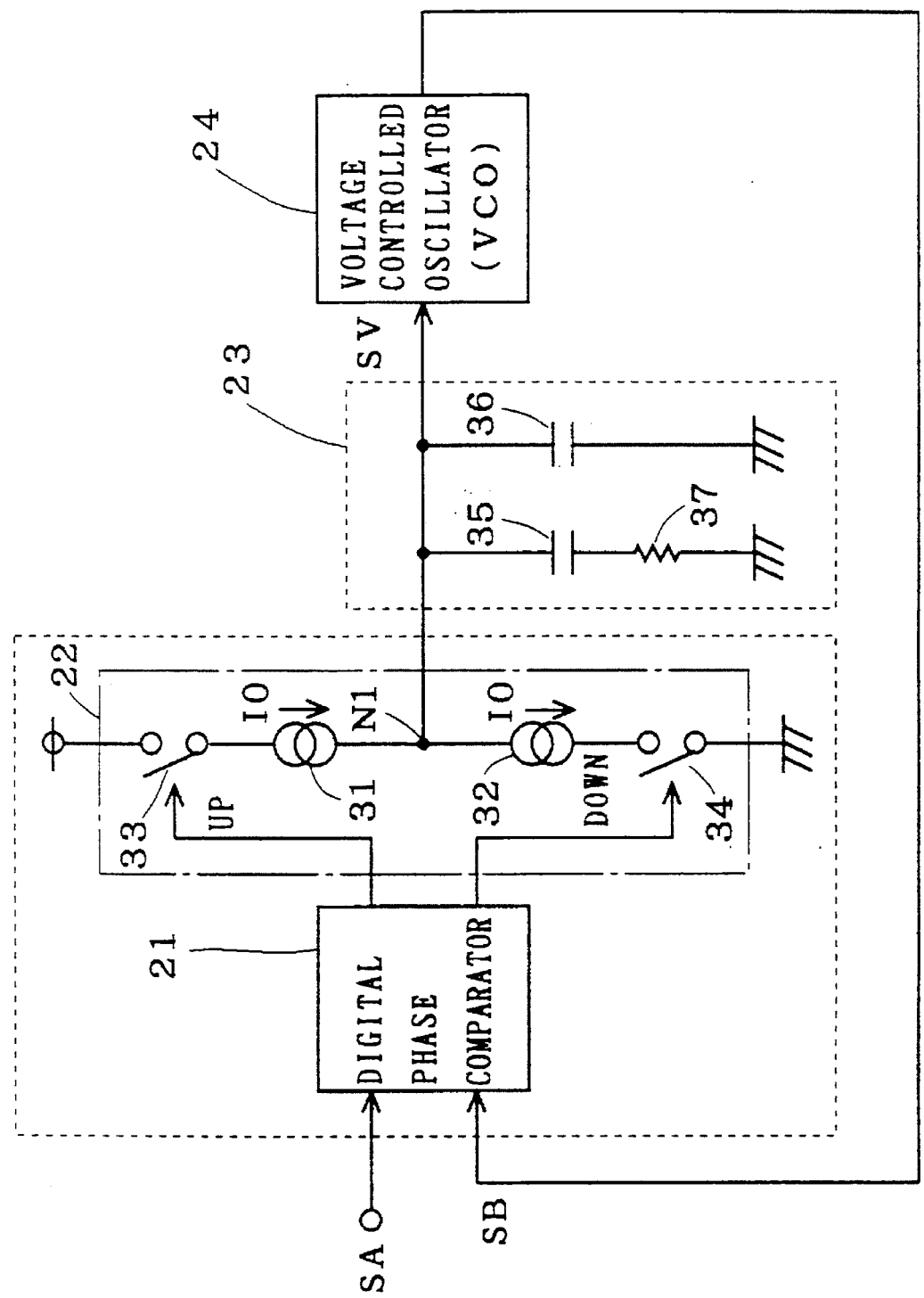
FIG. 12 is an explanatory diagram showing the structure of a PLL circuit.
Figure 13:
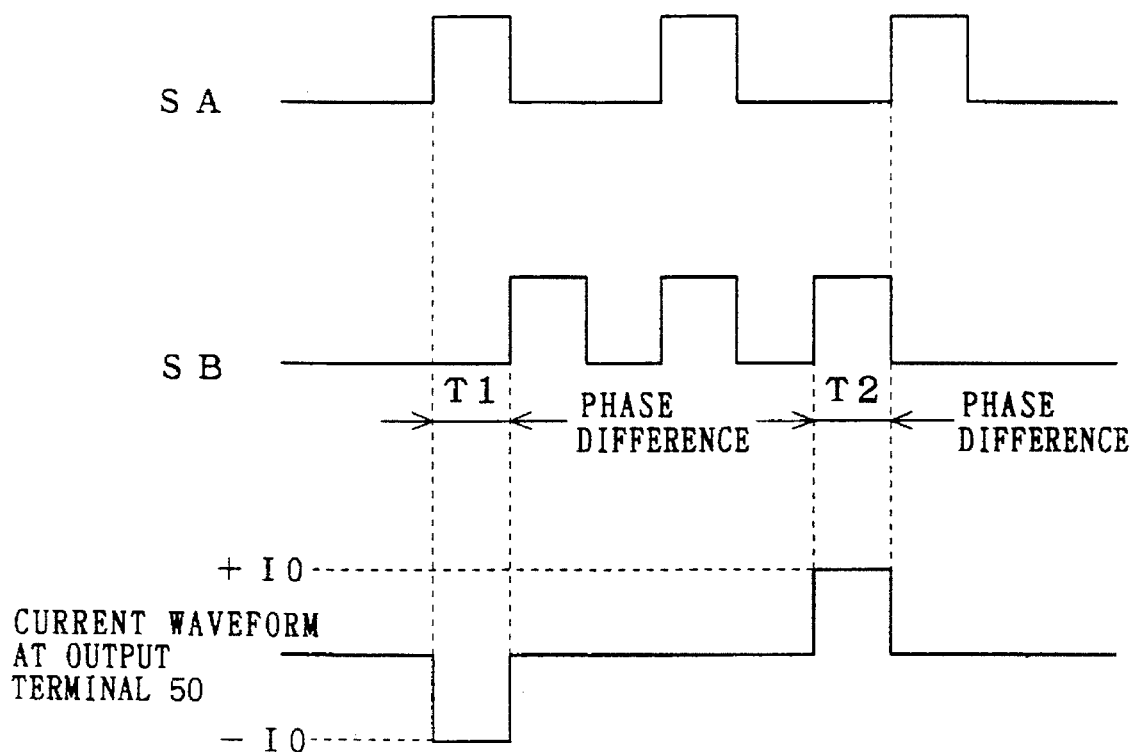
FIG. 13 is a waveform diagram showing operations of the PLL circuit.
Figure 14:
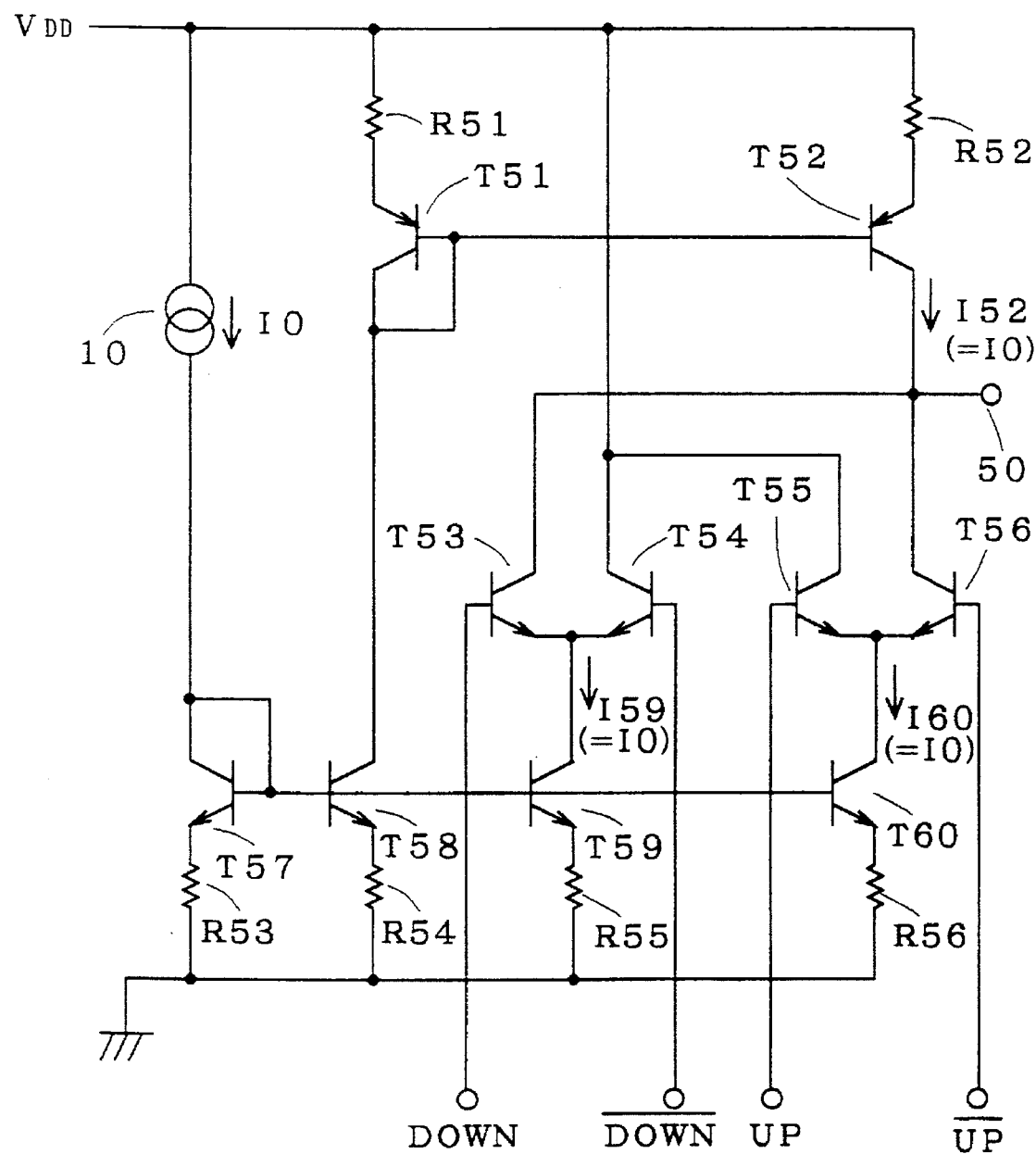
FIG. 14 is a circuit diagram showing the structure of a conventional charge pumping circuit.

When the charge pumping circuit according to the first embodiment is employed as the charge pumping circuit 22 in the PLL circuit shown in FIG. 12, therefore, the voltage range of the control voltage SV of the voltage controlled oscillator 24 is widened and the range of the oscillation frequency of the input signal SB which is the output of the voltage controlled oscillator 24 is also widened, whereby the locking range of the PLL circuit can be set to be wider than the conventional one. This effect is particularly effective when the PLL circuit is made to carry out a pressure reducing operation or a low voltage operation.

<First Modification of First Embodiment>

The transistor emitter side resistances R1 to R4 are generally practically provided for stabilizing the collector currents by removing dispersion. Therefore, the charge pumping circuit is operable also when the resistances R1 to R4 are omitted. FIG. 3 is a circuit diagram showing a first modification of the first embodiment of the present invention. As shown in FIG. 3, the resistances R1 to R4 are removed. The remaining structure is similar to the circuit structure shown in FIG. 1. In the first modification of the first embodiment having the aforementioned structure, it is possible to widen the voltage range of an output voltage V3 of a voltage charge pumping circuit further by $2\Delta V$, since no influences are exerted by voltage drops caused by resistances.

<Second Modification of First Embodiment>

Figure 4:
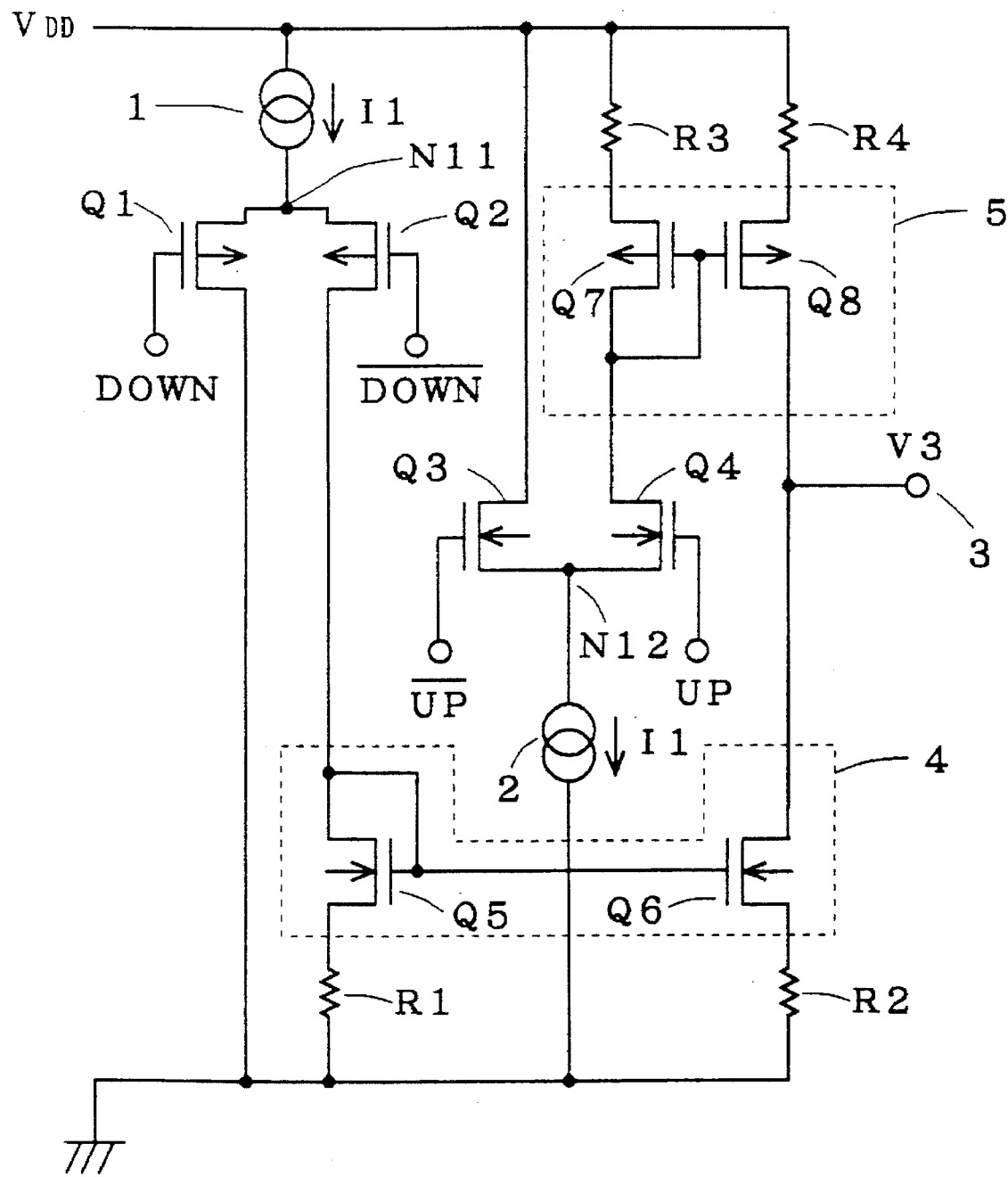
FIG. 4 is a circuit diagram showing a second modification of the first embodiment.

FIG. 4 is a circuit diagram showing a second modification of the first embodiment. As shown in FIG. 4, PMOS transistors Q1, Q2, Q7 and Q8 are provided in place of the PNP bipolar transistors T1, T2, T7 and T8, while NMOS transistors Q3 to Q6 are provided in place of the NPN bipolar transistors T3 to T6. The remaining structure is similar to the circuit structure shown in FIG. 1.

In the charge pumping circuit according to the second modification, high level side voltage drop elements are the PMOS transistor Q8 and a resistance R4 while low level side voltage build-up elements are the NMOS transistor Q6 and a resistance R2, whereby the voltage range of an output voltage V3 which is obtained from an output terminal 3 is decided in the following expression (III):

$$VDD-2VGS-2\Delta V \quad \text{(III)}$$

where VGS represents the gate-to-source voltage of the MOS transistor (Q8, Q6), and $\Delta V$ represents the amount of a voltage drop caused by the resistance (R4, R2) which is connected to the source of the MOS transistor.

As clearly understood from the expression (III), the charge pumping circuit according to the second modification can widen the voltage range of the output voltage V3 by 1VGS as compared with a conventional charge pumping circuit of a MOS transistor structure, thereby setting the locking range of a PLL circuit to be wider than that in the prior art.

Alternatively, the resistances R1 to R4 may be removed similarly to the first modification, to widen the voltage range of the output voltage V3 by $2\Delta V$.

<<Second Embodiment>>

Figure 5:
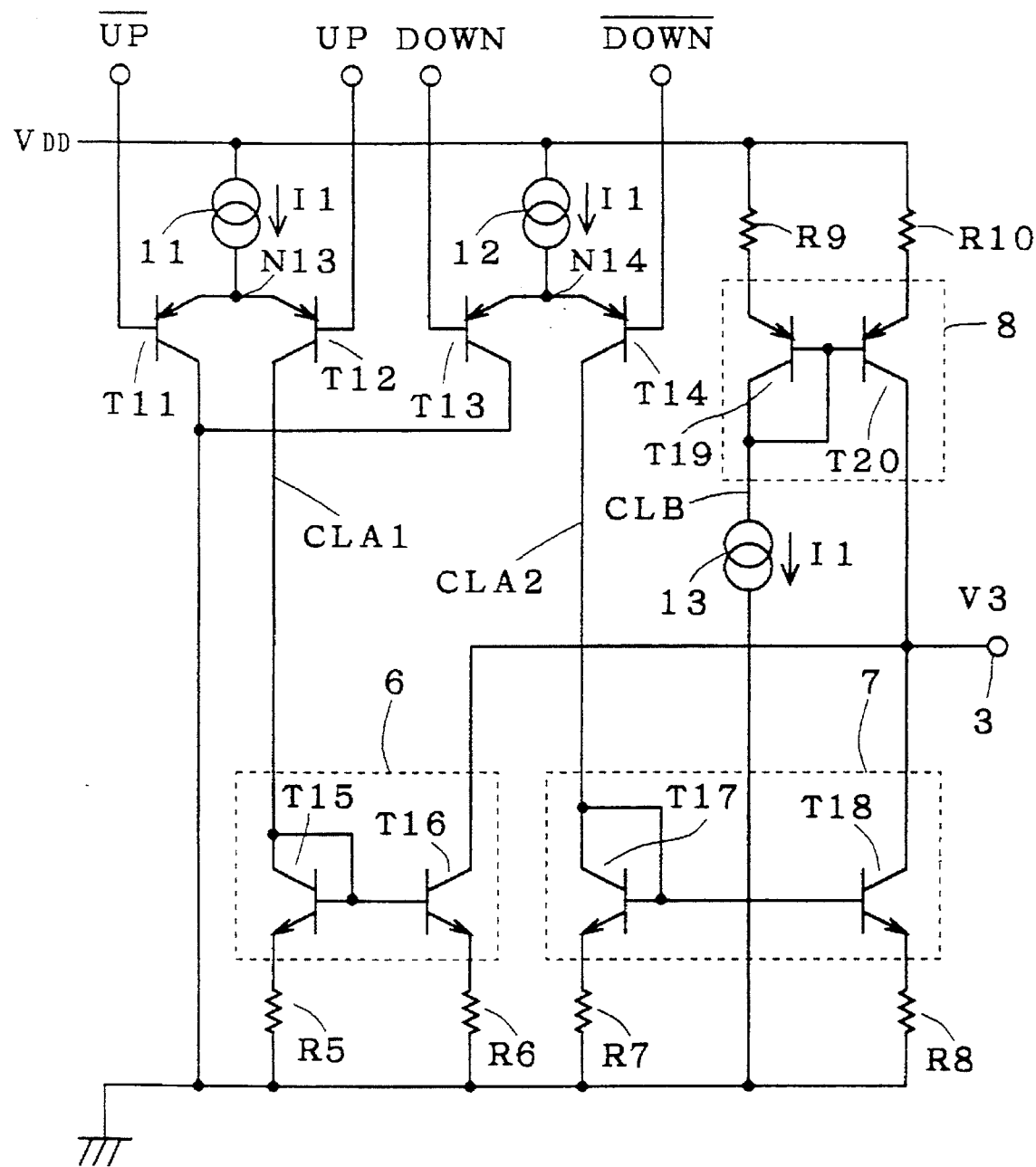
FIG. 5 is a circuit diagram showing the structure of a charge pumping circuit according to a second embodiment of the present invention.

FIG. 5 is a circuit diagram showing the internal structure of a charge pumping circuit according to a second embodiment of the present invention. The charge pumping circuit according to the second embodiment is inserted between the digital phase comparator 21 and the low-pass filter 23 in the PLL circuit shown in FIG. 12, similarly to the prior art.

As shown in FIG. 5, PNP bipolar transistors T11 and T12 form a differential pair, and bases thereof receive an inverted up signal/UP and an up signal UP respectively. Emitters of the PNP bipolar transistors T11 and T12 are connected in common at a node N13, and a constant current source 11 is interposed between the node N13 and a power source VDD. A collector of the PNP bipolar transistor T11 is grounded.

On the other hand, PNP bipolar transistors T13 and T14 form a differential pair, and bases thereof receive a down signal DOWN and an inverted down signal/DOWN respectively. Emitters of the PNP bipolar transistors T13 and T14 are connected in common at a node N14, and a constant current source 12 is interposed between the node N14 and the power source VDD. A collector of the PNP bipolar transistor T13 is grounded.

NPN bipolar transistors T15 and T16 form a current mirror circuit 6 with bases which are connected in common. An emitter of the NPN bipolar transistor T15 having a collector which is in common with the base is grounded through a resistance R5, while its collector (base) is connected to that of the PNP bipolar transistor T12. An emitter of the NPN bipolar transistor T16 is grounded through a resistance R6, while its collector is connected to an output terminal 3.

Therefore, a current path CLA1 between the constant current source 11 and the current mirror circuit 6 enters a conducting state when the PNP bipolar transistor T12 is in an ON state, while the former enters a non-conducting state when the latter is in an OFF state. When the PNP bipolar transistor T12 is in an ON state (the current path CLA1 is in a conducting state), a current of an amount I1 which is supplied from the constant current source 11 through the current path CLA1 flows as a collector current of the NPN bipolar transistor T16. Namely, the PNP bipolar transistors T11 and T12 forming a differential pair serve as switching means for controlling conduction/disconnection of the current path CLA1.

NPN bipolar transistors T17 and T18 form a current mirror circuit 7 with bases which are connected in common. An emitter of the NPN bipolar transistor 17 having a collector which is in common with the base is grounded through a resistance R7, while its collector (base) is connected to that of the PNP bipolar transistor T14. An emitter of the NPN bipolar transistor T18 is grounded through a resistance R8, while its collector is connected to the output terminal 3.

Therefore, a current path CLA2 between the constant current source 12 and the current mirror circuit 7 enters a conducting state when the PNP bipolar transistor T14 is in an ON state, while the former enters a non-conducting state when the latter is in an OFF state. When the PNP bipolar transistor T14 is in an ON state (the current path CLA2 is in a conducting state), a current of the amount I1 which is supplied from the constant current source 12 through the current path CLA2 flows as a collector current of the NPN bipolar transistor T18. Namely, the PNP bipolar transistors T13 and T14 forming a differential pair serve as switching means for controlling conduction/disconnection of the current path CLA2.

PNP bipolar transistors T19 and T20 form a current mirror circuit 8 with bases which are connected in common. An emitter of the PNP bipolar transistor T7 having a collector which is in common with the base is connected to a power source VDD through a resistance R9, and a constant current source 13 is interposed between its collector (base) and the ground level. An emitter of the PNP bipolar transistor T20 is connected to the power source VDD through a resistance R10, while its collector is connected to the output terminal 3.

Therefore, a current path CLB between the constant current source 13 and the current mirror circuit 8 is regularly in a conducting state, whereby a current which is supplied from the constant current source 13 flows as a collector current of the PNP bipolar transistor T20.

Each of the constant current sources 11 to 13 supplies a current of the amount I1, while the PNP bipolar transistors T11 to 14, T19 and T20 are identical in transistor size to each other, the NPN bipolar transistors T15 to T18 are also identical in transistor size to each other, and the resistances R5 to R8 are set at the same resistance values.

In the period T11 shown in FIG. 2 when the input signal SB lags the input signal SA in the aforementioned structure, the up signal UP and the down signal DOWN of the digital phase comparator 21 enter an active state and an inactive state respectively.

At this time, the PNP bipolar transistors T11 and T12 are turned on and off respectively, while the PNP bipolar transistors T13 and T14 are also turned on and off respectively. Thus, both of the current paths CLA1 and CLA2 enter non-conducting states.

Consequently, the collector current (amount: I1) of the PNP bipolar transistor T20 is supplied to the output terminal 3.

In the period T12 shown in FIG. 2 when the input signal SB leads the input signal SA, on the other hand, the up signal UP and the down signal DOWN of the digital phase comparator 21 enter an inactive state and an active state respectively.

At this time, the PNP bipolar transistors T11 and T12 are turned off and on respectively, while the PNP bipolar transistors T13 and T14 are also turned off and on respectively. Thus, both of the current paths CLA1 and CLA2 enter conducting states.

Consequently, the collector current (amount: I1) of the PNP bipolar transistor T20 is supplied to the output terminal 3, while the collector currents (amounts: I1) of the NPN bipolar transistors T16 and T18 are extracted from the output terminal 3, whereby I1−2·I1=−I1, and a current of the amount I1 is extracted from the output terminal 3.

When both of the up signal UP and the down signal DOWN of the digital phase comparator 21 are in inactive states, the PNP bipolar transistors T11 and T12 are turned off and on respectively, while the PNP bipolar transistors T13 and T14 are turned on and off respectively. Therefore, both of the current paths CLA1 and CLA2 enter non-conducting states, whereby I1−I1=0 and no current flows to the output terminal 3.

Thus, the charge pumping circuit according to the second embodiment carries out a sink operation (extraction) and a source operation (supply) on the constant current I1 with respect to the output terminal 3, on the basis of the up signal UP and the down signal DOWN of the digital phase comparator 21.

In the charge pumping circuit according to the second embodiment, high level side voltage drop elements are the PNP bipolar transistor T20 and the resistance R10 while low level side voltage build-up elements are the NPN bipolar transistor T16 (T18) and the resistance R6 (R8), whereby the voltage range of an output voltage V3 which is obtained from the output terminal 3 is decided in the following expression (IV):

$$VDD - 2VBE - 2\Delta V \quad \text{(IV)}$$

where VBE represents the base-to-emitter voltage of the bipolar transistor (T20, T16 (T18)), and $\Delta V$ represents the amount of a voltage drop caused by the resistance (R10, R6 (R8)) which is connected to the emitter of the bipolar transistor.

As clearly understood from the expression (IV), the charge pumping circuit according to the second embodiment can widen the voltage range of the output voltage V3 by 1VBE as compared with that of a conventional structure. When the charge pumping circuit according to the second embodiment is employed as the charge pumping circuit 22 in the PLL circuit shown in FIG. 12, therefore, the locking range of the PLL circuit can be set to be wider than the conventional one, similarly to the first embodiment.

Further, switching means (T11, T12, T13 and T14) for controlling conduction/non-conduction of the current paths CLA1 and CLA2 respectively are formed by differential pairs of PNP bipolar transistors, whereby on-off switching times can be correctly set at the same times.

Therefore, the switching means of the charge pumping circuit according to the second embodiment can regularly carry out correct operations regardless of signal modes of the up signal UP and the down signal DOWN, whereby a charge pumping circuit having high operation accuracy can be attained.

<First Modification of Second Embodiment>

Figure 6:
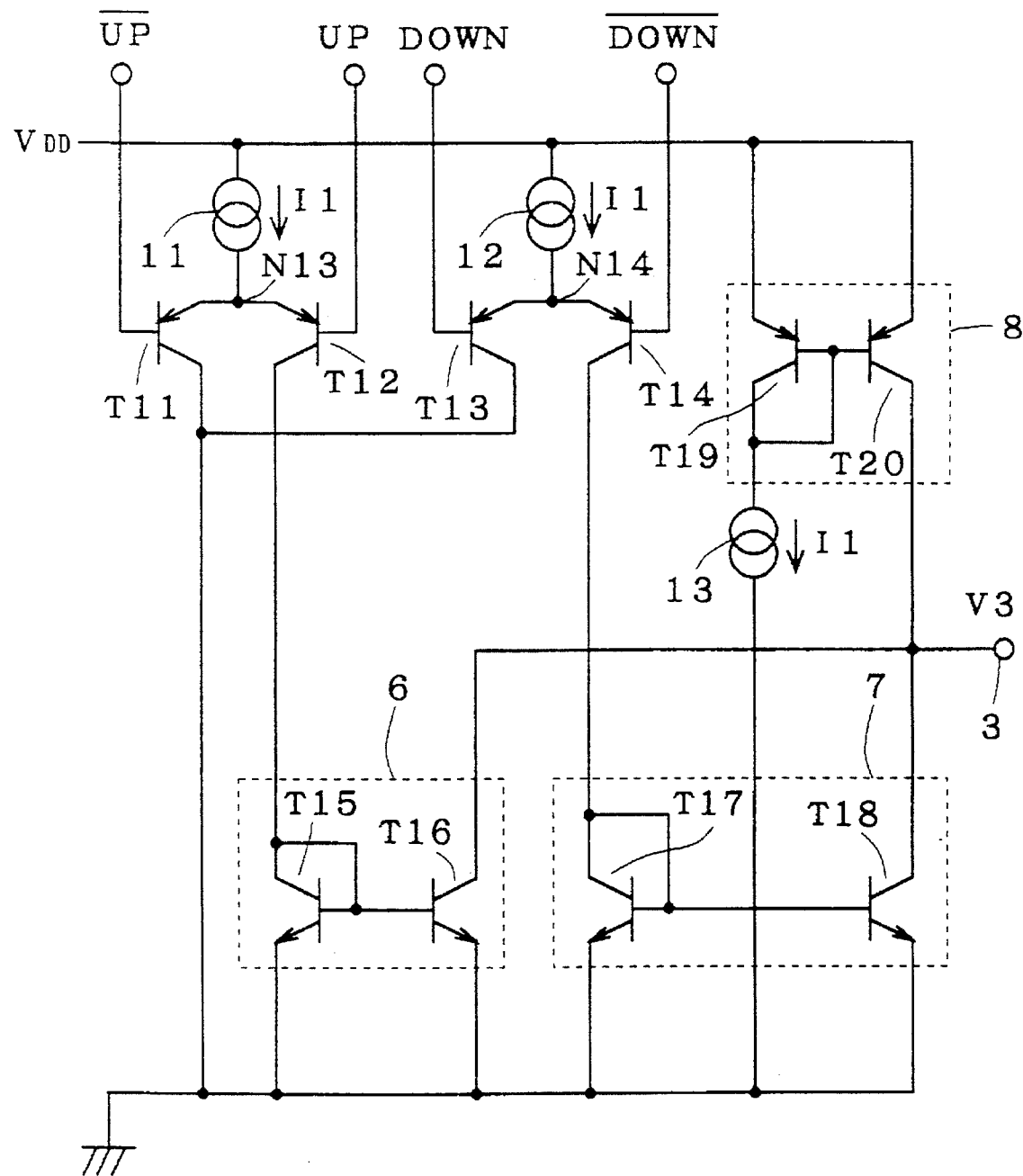
FIG. 6 is a circuit diagram showing a first modification of the second embodiment.

FIG. 6 is a circuit diagram showing a first modification of the second embodiment of the present invention. As shown in FIG. 6, resistances R5 to R10 are removed. The remaining structure is similar to the circuit structure shown in FIG. 5. In the first modification of the second embodiment having the aforementioned structure, it is possible to widen the voltage range of an output voltage V3 of the voltage charge pumping circuit further by 2ΔV, since no influences are exerted by voltage drops caused by resistances.

<Second Modification of Second Embodiment>

Figure 7:
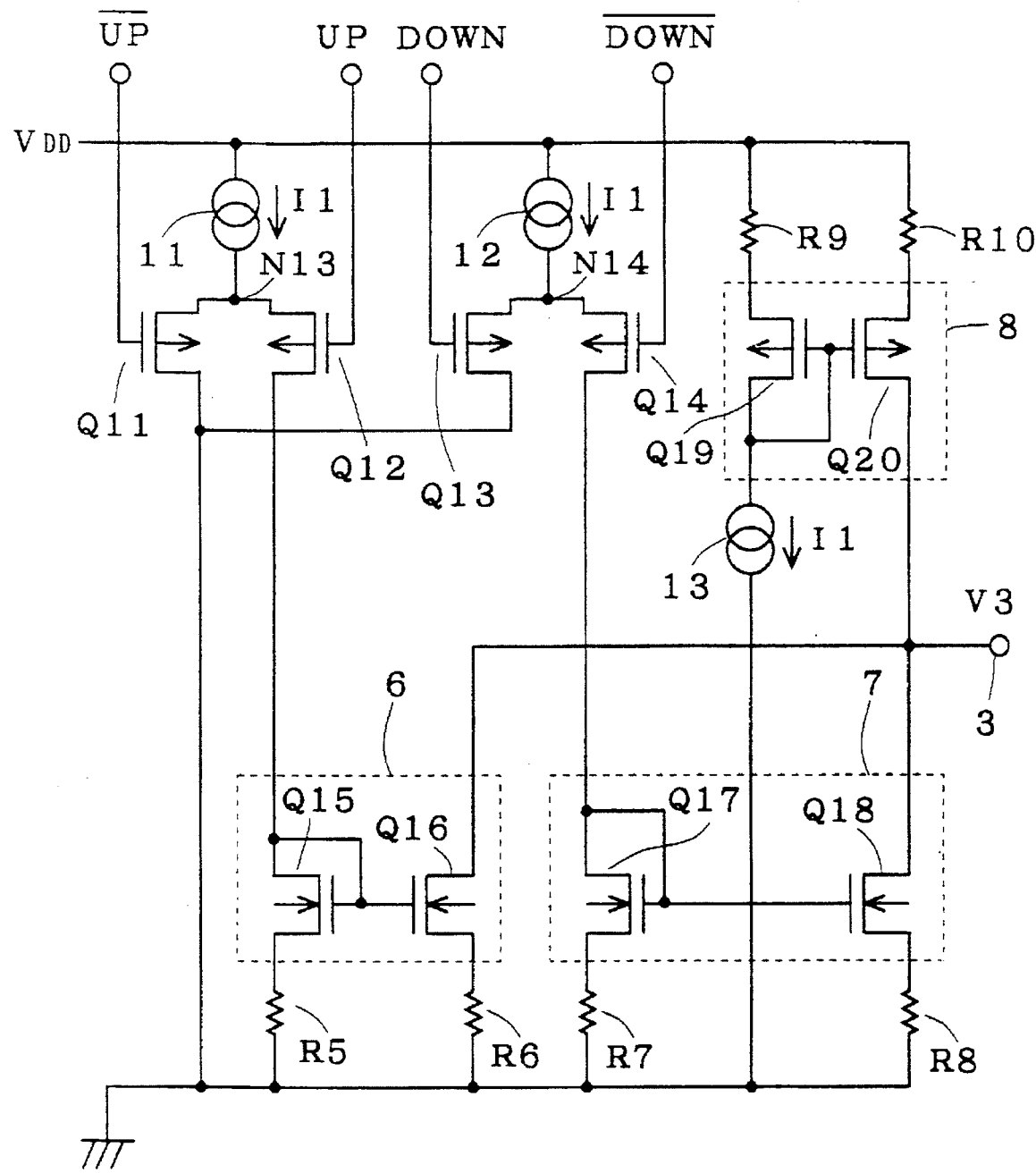
FIG. 7 is a circuit diagram showing a second modification of the second embodiment.

FIG. 7 is a circuit diagram showing a second modification of the second embodiment. As shown in FIG. 7, PMOS transistors Q11 to Q14, Q19 and Q20 are provided in place of the PNP bipolar transistors T11 to T14, T19 and T20, while NMOS transistors Q15 to Q18 are provided in place of the NPN bipolar transistors T15 to T18. The remaining structure is similar to the circuit structure shown in FIG. 5.

In the charge pumping circuit according to the second modification, high level side voltage drop elements are the PMOS transistor Q20 and a resistance R10 while low level side voltage build-up elements are the NMOS transistor Q16 (Q18) and a resistance R6 (R8), whereby the voltage range of an output voltage V3 which is obtained from an output terminal 3 is decided in the following expression (V):

$$VDD - 2VGS2\Delta V \quad (V)$$

where VGS represents the gate-to-source voltage of the MOS transistor (Q20, Q16 (Q18)), and ΔV represents the amount of a voltage drop caused by the resistance (R10, R6 (R8)) which is connected to the source of the MOS transistor.

As clearly understood from the expression (V), the charge pumping circuit according to the second modification can widen the voltage range of the output voltage V3 by 1VGS as compared with a conventional charge pumping circuit of a MOS transistor structure, thereby setting the locking range of a PLL circuit to be wider than that in the prior art.

Alternatively, the resistances R5 to R10 may be removed similarly to the first modification, to widen the voltage range of the output voltage V3 by 2ΔV.

<<Third Embodiment>>

Figure 8:
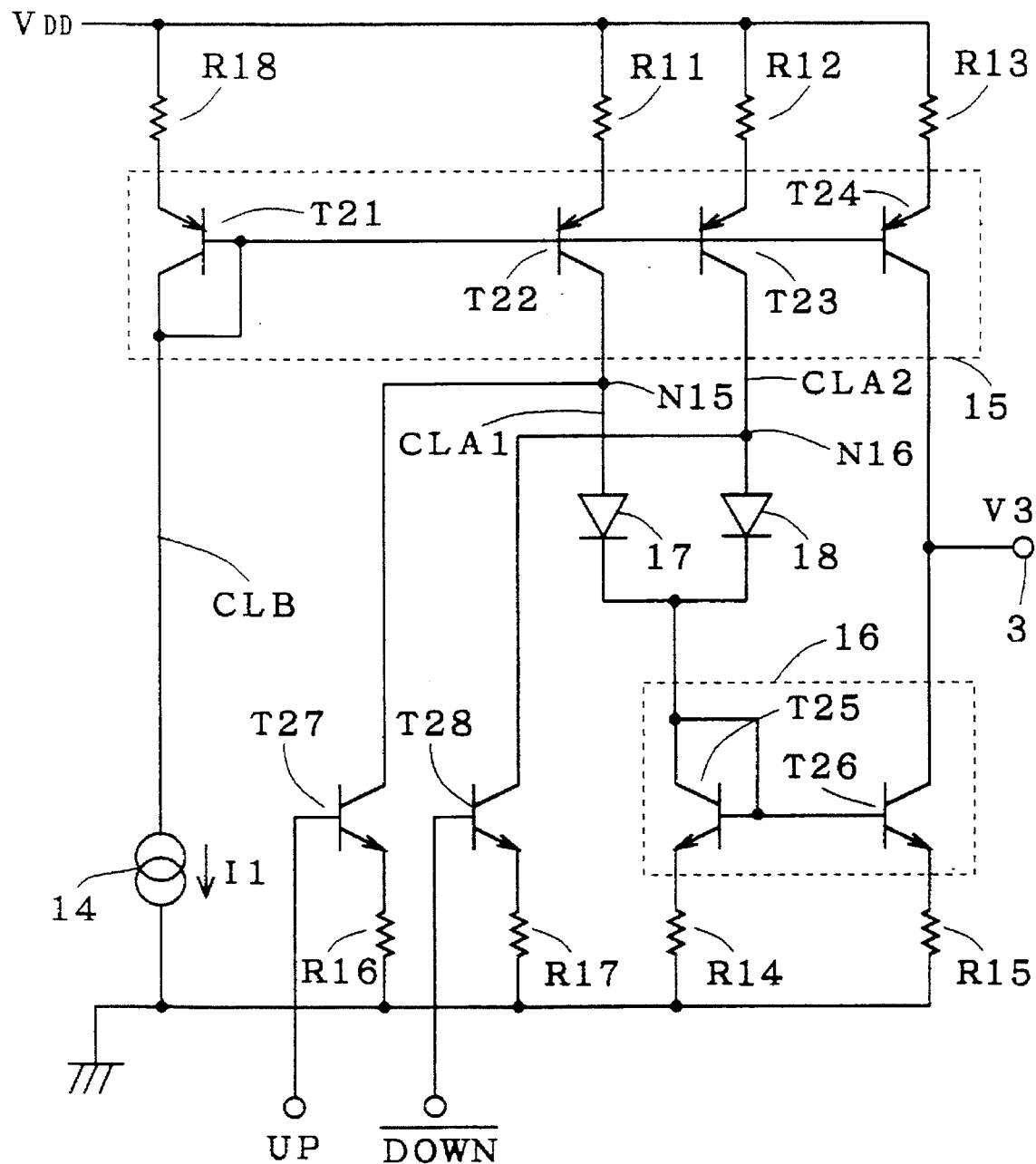
FIG. 8 is a circuit diagram showing the structure of a charge pumping circuit according to a third embodiment of the present invention.

FIG. 8 is a circuit diagram showing the internal structure of a charge pumping circuit according to a third embodiment of the present invention. The charge pumping circuit according to the third embodiment is inserted between the digital phase comparator 21 and the low-pass filter 23 in the PLL circuit shown in FIG. 12, similarly to the prior art.

As shown in FIG. 8, PNP bipolar transistors T21 to T24 form a current mirror circuit 15 with bases which are connected in common. An emitter of the PNP bipolar transistor T21 having a collector which is in common with the base is connected to a power source VDD through a resistance R18, and a constant current source 14 (current amount: I1) is interposed between its collector (base) and the ground level. Emitters of the PNP bipolar transistors T22, T23 and T24 are connected to the power source VDD through resistances R11, R12 and R13 respectively. Collectors of the PNP bipolar transistors T22 and T23 are connected to anodes of diodes 17 and 18 respectively, while that of the PNP bipolar transistor T24 is connected to an output terminal 3.

Therefore, a current path CLB between the constant current source 14 and the current mirror circuit 15 is regularly allowed to conduct, whereby the current mirror circuit 15 supplies currents of the same amount I1 as that supplied from the constant current source 14 as collector currents of the PNP bipolar transistors T22, T23 and T24 respectively.

On the other hand, NPN bipolar transistors T25 and T26 form a current mirror circuit 16 with bases which are connected in common. An emitter of the NPN bipolar transistor T25 having a collector which is in common with the base is grounded through a resistance R14, while its collector (base) is connected to cathodes of the diodes 17 and 18. An emitter of the NPN bipolar transistor T26 is grounded through a resistance R15, while its collector is connected to the output terminal 3.

An NPN bipolar transistor T27 has a base which receives an up signal UP, a collector which is connected to a node N15 between the transistor T22 and the diode 17, and an emitter which is grounded through a resistance R16. An NPN bipolar transistor T28 has a base which receives an inverted down signal/DOWN, a collector which is connected to a node N16 between the transistor T23 and the diode 18, and an emitter which is grounded through a resistance R17.

Therefore, a current path CLA1 between the collector of the transistor T22 and the current mirror circuit 16 is guided to the ground level to enter a cutoff state when the NPN bipolar transistor T27 is in an ON state, while the former enters a conducting state when the latter is in an OFF state. On the other hand, a current path CLA2 between the collector of the transistor T23 and the current mirror circuit 16 is guided to the ground level to enter a cutoff state when the NPN bipolar transistor T26 is in an ON state, while the former enters a conducting state when the latter is in an OFF state.

In the current mirror circuit 16, a current which is based on a collector current of the NPN bipolar transistor T25 flows as a collector current of the NPN bipolar transistor T26 when at least one of the NPN bipolar transistors T27 and T28 is in an OFF state, i.e., when at least one of the current paths CLA1 and CLA2 is in a conducting state.

The amount of the collector current of the NPN bipolar transistor T26 is I1 when only one of the NPN bipolar transistors T27 and T28 is turned off, while the same is 2·I1 when both transistors T27 and T28 are turned off.

When one of the NPN bipolar transistors T27 and T28 is turned on and the other one is turned off, there is such a possibility that a current reversely flows across the nodes N15 and N16. When the NPN bipolar transistors T27 and T28 are turned on and off respectively, for example, the collector current of the PNP bipolar transistor T23 appearing at the node N16 starts to flow to the ground level through the node N15 and the transistor T27. The diodes 17 and 18 are adapted to reliably inhibit the reverse current.

In the period T11 shown in FIG. 2 when the input signal SB lags the input signal SA in the aforementioned structure, both of the up signal UP and the inverted down signal/DOWN of the digital phase comparator 21 enter active states.

At this time, both of the NPN bipolar transistors T27 and T28 are turned on, whereby both of the current paths CLA1 and CLA2 enter non-conducting states. Consequently, the collector current (amount: I1) of the PNP bipolar transistor T24 is supplied to the output terminal 3.

In the period T12 shown in FIG. 2 when the input signal SB leads the input signal SA, on the other hand, both the up signal UP and the inverted down signal/DOWN/of the digital phase comparator 21 enter inactive states.

At this time, both of the NPN bipolar transistors T27 and T28 are turned off, whereby both of the current paths CLA1 and CLA2 enter conducting states, and the amount of the collector current of the NPN bipolar transistor T26 is 2·I1.

Consequently, the collector current (amount: I1) of the PNP bipolar transistor T24 is supplied to the output terminal 3, while the collector current (amount: I1) of the NPN bipolar transistor T26 is extracted from the output terminal 3, whereby I1−2·I1=−I1, and a current of the amount I1 is extracted from the output terminal 3.

When both of the up signal UP and the down signal DOWN of the digital phase comparator 21 are in inactive states, the NPN bipolar transistors T27 and T28 are turned off and on respectively. Therefore, both of the current paths CLA1 and CLA2 enter non-conducting states, whereby I1−I1=0 and no current flows to the output terminal 3.

Thus, the charge pumping circuit according to the third embodiment carries out a sink operation (extraction) and a source operation (supply) on the constant current I1 with respect to the output terminal 3, on the basis of the up signal UP and the down signal DOWN of the digital phase comparator 21.

In the charge pumping circuit according to the third embodiment, high level side voltage drop elements are the PNP bipolar transistor T24 and the resistance R13 while low level side voltage build-up elements are the NPN bipolar transistor T26 and the resistance R15, whereby the voltage range of an output voltage V3 which is obtained from the output terminal 3 is decided in the following expression (VI):

$$VDD-2VBE-3\Delta V \qquad (VI)$$

where VBE represents the base-to-emitter voltage of the bipolar transistor (T24, T26), and $\Delta V$ in case of flowing of a current of an amount I1 represents the amount of a voltage drop caused by the resistance (R13, R15) which is connected to the emitter of the bipolar transistor. A current of the amount I1 flows to the resistance R13, while that of an amount 2·I1 flows to the resistance R15. Further, a relation VBE>$\Delta V$ holds.

As clearly understood from the expression (VI), the charge pumping circuit according to the third embodiment can widen the voltage range of the output voltage V3 by (VBE−$\Delta V$) as compared with that of a conventional structure. When the charge pumping circuit according to the third embodiment is employed as the charge pumping circuit 22 in the PLL circuit shown in FIG. 12, therefore, the locking range of the PLL circuit can be set to be wider than the conventional one, similarly to the first and second embodiments.

Further, switching means for controlling conduction/non-conduction of the current paths CLA1 and CLA2 are formed by the NPN bipolar transistors T27 and T28, whereby on-off switching times can be correctly set at the same times similarly to the second embodiment, thereby obtaining a charge pumping circuit having high operation accuracy.

The NPN bipolar transistors carry out switching operations at a higher speed as compared with PNP bipolar transistors, whereby operations of higher accuracy are enabled.

<First Modification of Third Embodiment>

Figure 9:
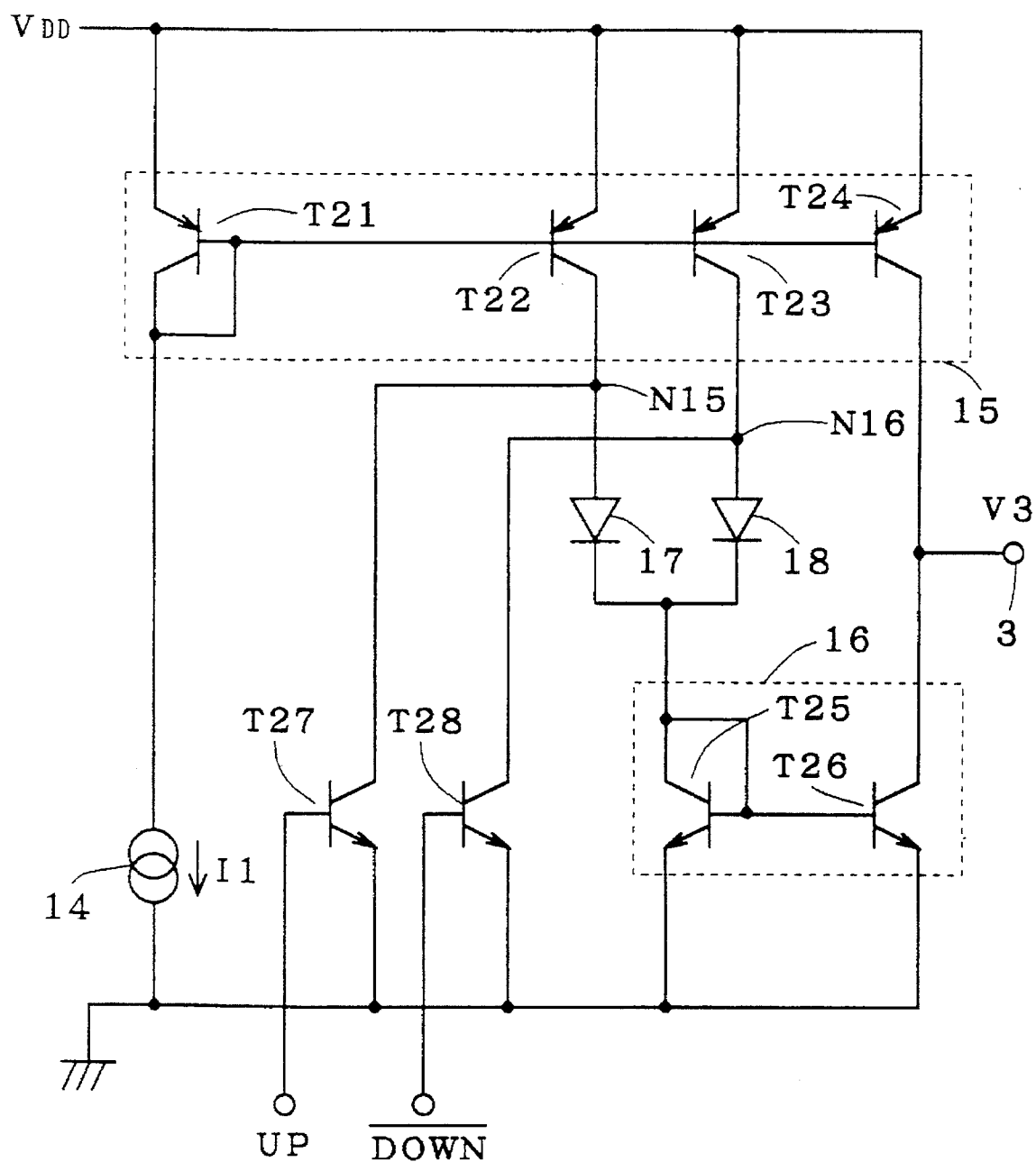
FIG. 9 is a circuit diagram showing a first modification of the third embodiment.

FIG. 9 is a circuit diagram showing a first modification of the third embodiment of the present invention. As shown in FIG. 9, resistances R1 to R18 are removed. The remaining structure is similar to the circuit structure shown in FIG. 8. In the first modification of the third embodiment having the aforementioned structure, it is possible to widen the voltage range of an output voltage V3 of a voltage charge pumping circuit further by 2$\Delta V$, since no influences are exerted by voltage drops caused by resistances.

<Second Modification of Third Embodiment>

Figure 10:
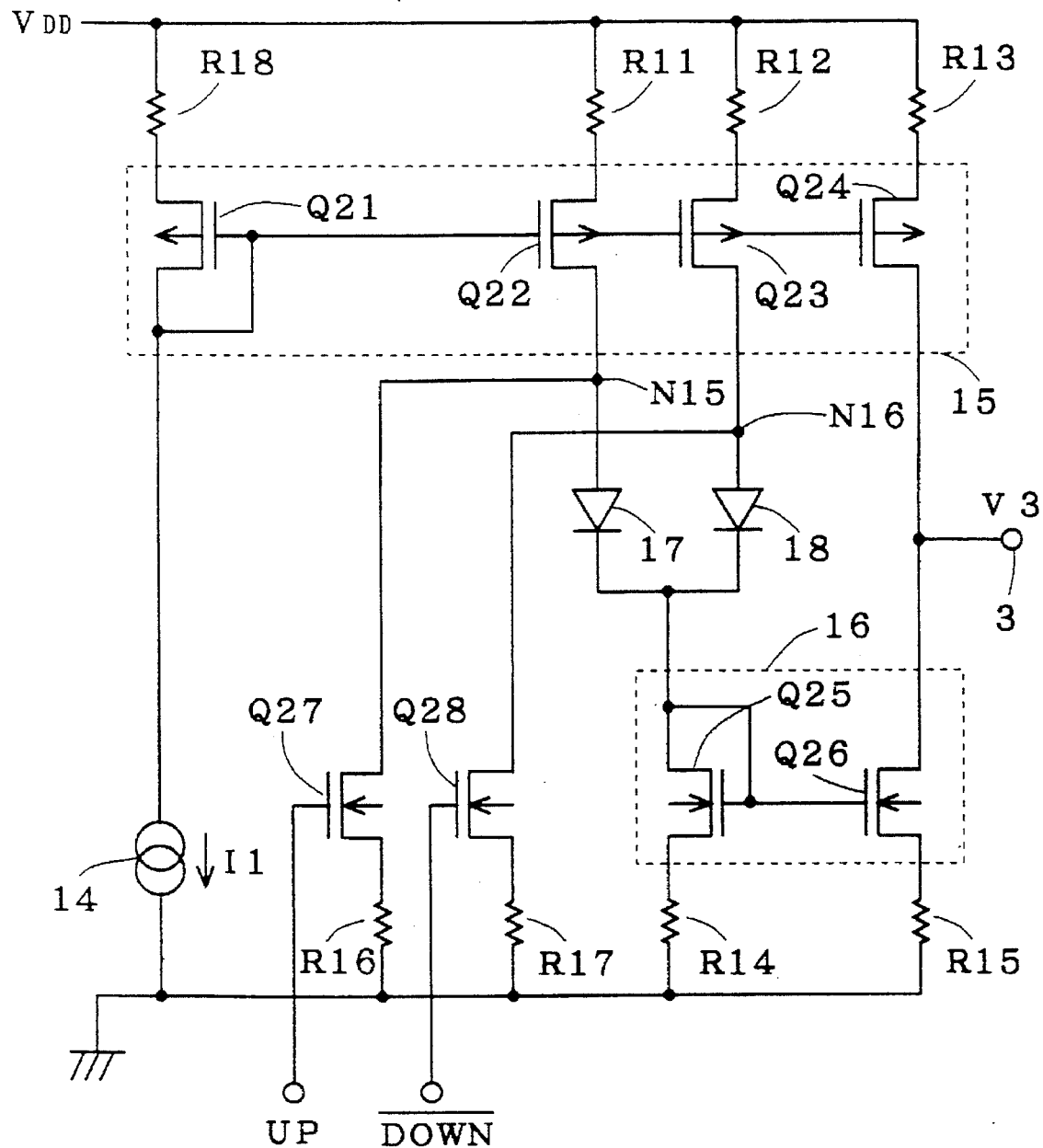
FIG. 10 is a circuit diagram showing a second modification of the third embodiment.

FIG. 10 is a circuit diagram showing a second modification of the third embodiment. As shown in FIG. 10, PMOS transistors Q21 to Q24 are provided in place of the PNP bipolar transistors T21 to T24, while NMOS transistors Q25 to Q28 are provided in place of the NPN bipolar transistors T25 to T28. The remaining structure is similar to the circuit structure shown in FIG. 8.

In the charge pumping circuit according to the second modification, high level side voltage drop elements are the PMOS transistor Q24 and a resistance R13 while low level side voltage build-up elements are the NMOS transistor Q26 and a resistance R15, whereby the voltage range of an output voltage V3 which is obtained from an output terminal 3 is decided in the following expression (VII):

$$VDD-2VGS-3\Delta V \qquad (VII)$$

where VGS represents the gate-to-source voltage of the MOS transistor (Q24, O26), and $\Delta V$ represents the amount of a voltage drop caused by the resistance (R13, R15) which is connected to the source of the bipolar transistor.

As clearly understood from the expression (VII), the charge pumping circuit according to the second modification can widen the voltage range of the output voltage V3 by (VGS−$\Delta V$) as compared with a conventional charge pumping circuit of a MOS transistor structure, thereby setting the locking range of a PLL circuit to be wider than that in the prior art.

Alternatively, the resistances R11 to R18 may be removed similarly to the first modification, to widen the voltage range of the output voltage V3 by 2$\Delta V$.

<Third Modification of Third Embodiment>

Figure 11:
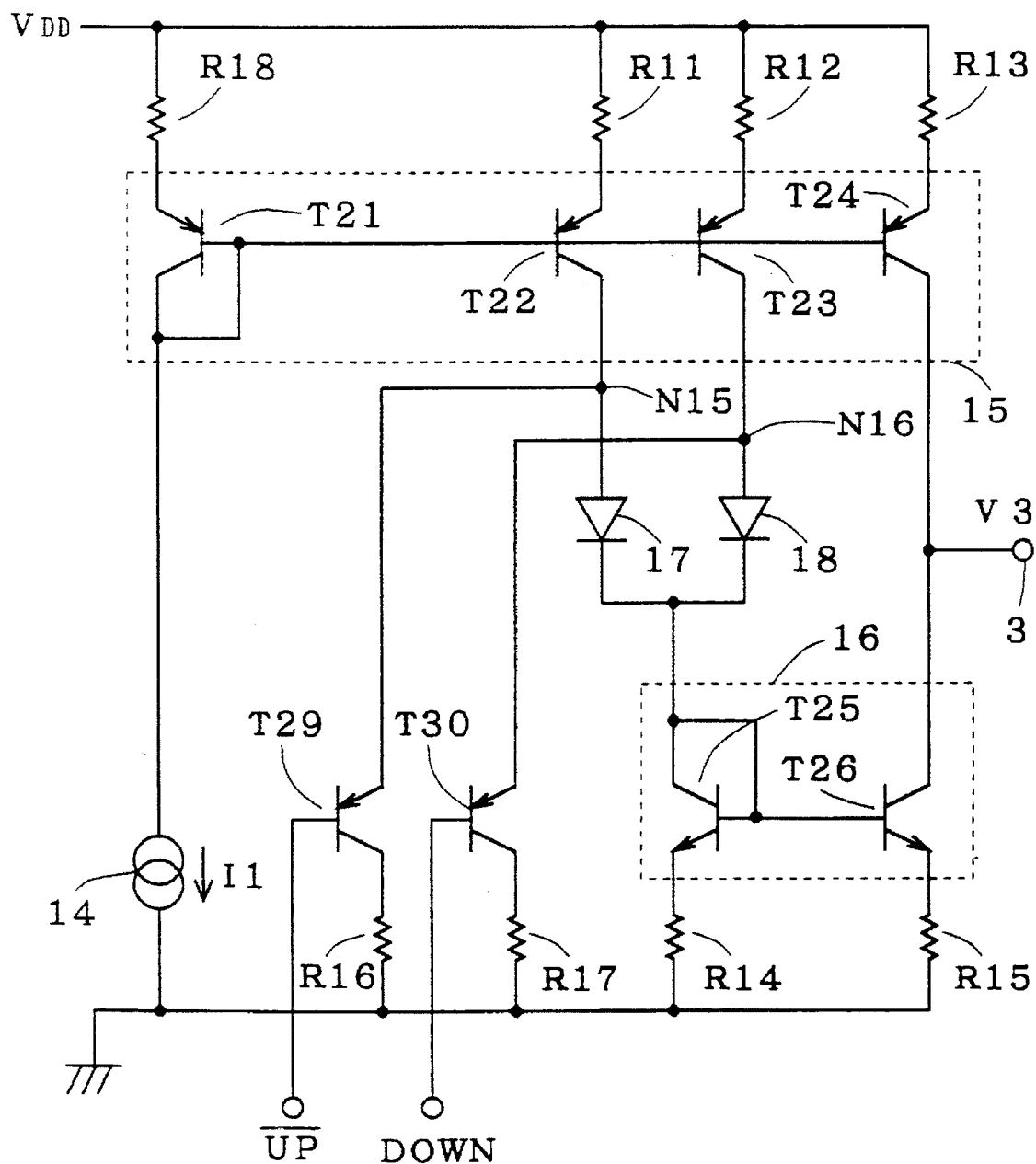
FIG. 11 is a circuit diagram showing a third modification of the third embodiment.

FIG. 11 is a circuit diagram showing a third modification of the third embodiment. As shown in FIG. 11, PNP bipolar transistors T29 and T30 may be provided in place of the NPN bipolar transistors T27 and T28, for receiving an inverted up signal/UP and a down signal DOWN in bases of the PNP bipolar transistors T29 and T30 respectively.

While the invention has been shown and described in detail, the foregoing description is in all aspects illustrative and not restrictive. It is therefore understood that numerous modifications and variations can be devised without departing from the scope of the invention.

What is claimed is:

1. A charge pumping circuit comprising:
   an output terminal;
   first current supply means for supplying a first current to a first current path;
   second current supply means for supplying a second current to a second current path;
   a first current mirror circuit being connected to a first power source and said output terminal, for supplying a first current mirror current being proportional in amount to said first current in a first condition from said first power source to said output terminal during conduction of current in said first current path;

a second current mirror circuit being connected to a second power source and said output terminal, for supplying a second current mirror current being proportional in amount to said second current in a second condition from said output terminal to said second power source during conduction of current in said second current path;

control means receiving one of first and second switching control signals of complementary logic for controlling conduction of at least one of said first and second current paths on the basis of said one of first and second switching control signals and carrying out a source operation of feeding a current from said first power source to said output terminal or a sink operation of feeding a current from said output terminal to said second power source, comprising, first switching means provided on said first current path for receiving said first switching control signal and a logically inverted signal of said first switching control signal, and second switching means provided on said second current path for receiving said second switching control signal and a logically inverted signal of said second switching control signal;

said first switching means comprises a differential pair of first conductivity type first and second transistors, for receiving said first switching control signal and said logically inverted signal of said first switching control signal in control electrodes of said first and second transistors respectively, and allowing conduction or non-conduction of current in said first current path by turning one of said first and second transistors on or off; and said second switching means comprises a differential pair of second conductivity type third and fourth transistors, for receiving said second switching control signal and said logically inverted signal of said second switching control signal in control electrodes of said third and fourth transistors respectively, and allowing conduction or non-conduction of current in said second current path by turning one of said third and fourth transistors on or off.

2. The charge pumping circuit in accordance with claim 1, wherein said control means carries out said source operation or said sink operation by bringing one of said first and second current paths into a conducting state and bringing the other one into a cutoff state.

3. The charge pumping circuit in accordance with claim 2, wherein said first current mirror circuit is connected to said first power source through a first resistance component, and said second current mirror circuit is connected to said second power source through a second resistance component.

4. The charge pumping circuit in accordance with claim 2, wherein said first current mirror circuit is directly connected to said first power source, and said second current mirror circuit is directly connected to said second power source.

5. The charge pumping circuit in accordance with claim 3, wherein:

said first resistance component has first and second resistances and said second resistance component has third and fourth resistances;

said first current mirror circuit has second conductivity type fifth and sixth transistors sharing a control electrode, said fifth transistor having a first electrode connected to said first power source through said first resistance as well as said control electrode and a second electrodes connected to said first current path, said sixth transistor having a first electrode connected to said first power source through said second resistance and a second electrode connected to said output terminal; and said second current mirror circuit has first conductivity type seventh and eighth transistors sharing a control electrode, said seventh transistor having a first electrode connected to said second power source through said third resistance as well as said control electrode and a second electrode connected to said second current path, said eighth transistor having a first electrode connected to said second power source through said fourth resistance and a second electrode connected to said output terminal.

6. The charge pumping circuit in accordance with claim 5, wherein said first conductivity type is an N type, and said second conductivity type is a P type.

7. The charge pumping circuit in accordance with claim 6, wherein said first to eighth transistors are bipolar transistors.

8. The charge pumping circuit in accordance with claim 7, wherein said first to eighth transistors are MOS transistors.

9. A PLL circuit comprising:

phase comparison means receiving first and second input signals for outputting a control signal on the basis of a phase difference between said first and second input signals;

a charge pumping circuit receiving said control signal for outputting an output voltage on the basis of said control signal;

filtering means for filtering said output voltage and for generating a control voltage;

oscillation means receiving said control voltage for outputting said second input signal which is oscillated at a frequency based on said control voltage;

said charge pumping circuit further comprising:

an output terminal obtaining said output voltage, first current supply means for supplying a first current to a first current path, second current supply means for supplying a second current to a second current path, a first current mirror circuit connected to a first power source and said output terminal for supplying a first current mirror current proportional in amount to said first current in a first condition from said first power source to said output terminal during conduction of current in said first current path, a second current mirror circuit connected to a second power source and said output terminal, for supplying a second current mirror current proportional in amount to said second current in a second condition from said output terminal to said second power source during conduction of current in said second current path, and control means controlling conduction of at least one of said first and second current paths on the basis of said control signal and carrying out a source operation of feeding a current from said first power source to said output terminal or a sink operation of feeding a current from said output terminal to said second power source;

said control signal is a first or second switching control signal of a complementary logic;

said control means further comprises,
- first switching means provided on said first current path for receiving said first switching control signal and a logically inverted signal of said first switching control signal, and
- second switching means provided on said second current path for receiving said second switching control signal and a logically inverted signal of said second switching control signal;

said first switching means comprises a differential pair of first conductivity type first and second transistors, for receiving said first switching control signal and said logically inverted signal of said first switching control signal in control electrodes of said first and second transistors respectively, and allowing conduction or non-conduction of current in said first current path by turning one of said first and second transistors on or off; and said second switching means comprises a differential pair of second conductivity type third and fourth transistors, for receiving said second switching control signal and said logically inverted signal of said second switching control signal in control electrodes of said third and fourth transistors respectively, and allowing conduction or non-conduction of current in said second current path by turning one of said third and fourth transistors on or off.

* * * * *